United States Patent
Shoyama et al.

(10) Patent No.: US 11,355,658 B2
(45) Date of Patent: Jun. 7, 2022

(54) IMAGING APPARATUS, METHOD OF MANUFACTURING THE SAME, AND CAMERA

(71) Applicant: CANON KABUSHIKI KAISHA, Tokyo (JP)

(72) Inventors: Toshihiro Shoyama, Kawasaki (JP); Hiroshi Takakusagi, Atsugi (JP); Yasuo Yamazaki, Saitama (JP); Hideaki Ishino, Fujisawa (JP); Toshiyuki Ogawa, Abiko (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/871,782

(22) Filed: May 11, 2020

(65) Prior Publication Data
US 2020/0274006 A1 Aug. 27, 2020

Related U.S. Application Data

(62) Division of application No. 15/170,148, filed on Jun. 1, 2016, now Pat. No. 10,693,023.

(30) Foreign Application Priority Data

Jun. 12, 2015 (JP) .................................. 2015-119712
Oct. 16, 2015 (JP) .................................. 2015-204674
Mar. 17, 2016 (JP) .................................. 2016-054470

(51) Int. Cl.
*H01L 27/146* (2006.01)
*H01L 31/0288* (2006.01)
*H01L 31/0392* (2006.01)

(52) U.S. Cl.
CPC ...... *H01L 31/0288* (2013.01); *H01L 27/1463* (2013.01); *H01L 27/14612* (2013.01);
(Continued)

(58) Field of Classification Search
CPC combination set(s) only.
See application file for complete search history.

(56) References Cited

U.S. PATENT DOCUMENTS 5,574,307 A 11/1996 Kageyama
5,734,195 A 3/1998 Takizawa et al.
(Continued)

FOREIGN PATENT DOCUMENTS

CN 1469494 A 1/2004
CN 103219348 A 7/2013
(Continued)

OTHER PUBLICATIONS

Partial European Search Report in European Application No. 16172095.8 (dated Mar. 8, 2017).

(Continued)

*Primary Examiner* — Jesse Y Miyoshi
(74) *Attorney, Agent, or Firm* — Venable LLP

(57) ABSTRACT

A method of manufacturing an imaging apparatus includes: preparing a substrate comprising a wafer and a silicon layer arranged on the wafer, the wafer including a first semiconductor region made of single crystal silicon with an oxygen concentration not less than $2\times10^{16}$ atoms/cm$^3$ and not greater than $4\times10^{17}$ atoms/cm$^3$, the silicon layer including a second semiconductor region made of single crystal silicon with an oxygen concentration lower than the oxygen concentration in the first semiconductor region; annealing the substrate in an atmosphere containing oxygen and setting the oxygen concentration in the second semiconductor region within the range not less than $2\times10^{16}$ atoms/cm$^3$ and not greater than $4\times10^{17}$ atoms/cm$^3$; and forming a photoelectric conversion element in the second semiconductor region after the annealing.

11 Claims, 15 Drawing Sheets

(52) U.S. Cl.
CPC .. *H01L 27/14643* (2013.01); *H01L 27/14689* (2013.01); *H01L 27/14692* (2013.01); *H01L 27/14698* (2013.01); *H01L 31/03921* (2013.01)

(56) References Cited

U.S. PATENT DOCUMENTS

| | | | |
|---|---|---|---|
| 5,874,348 | A | 2/1999 | Takizawa et al. |
| 6,136,672 | A | 10/2000 | Bourdelle et al. |
| 6,140,213 | A | 10/2000 | Takizawa et al. |
| 6,325,848 | B1 | 12/2001 | Watanabe |
| 6,911,594 | B2 | 6/2005 | Yasuno |
| 7,323,731 | B2 | 1/2008 | Yuzurihara et al. |
| 7,473,948 | B2 | 1/2009 | Yuzurihara et al. |
| 7,560,781 | B2 | 7/2009 | Gotoh et al. |
| 7,679,116 | B2 | 3/2010 | Yuzurihara et al. |
| 7,928,486 | B2 | 4/2011 | Yuzurihara et al. |
| 8,053,272 | B2 | 11/2011 | Ohtani et al. |
| 8,384,177 | B2 | 2/2013 | Endo |
| 9,202,842 | B2 | 12/2015 | Itahashi et al. |
| 9,412,773 | B2 | 8/2016 | Hirota |
| 10,103,186 | B2 | 10/2018 | Hirota |
| 2005/0202686 | A1 | 9/2005 | Saki et al. |
| 2006/0175613 | A1* | 8/2006 | Lee .................. H01L 21/3221 257/65 |
| 2007/0108487 | A1 | 5/2007 | Inoue et al. |
| 2007/0134895 | A1 | 6/2007 | Matsuyama et al. |
| 2008/0251822 | A1 | 10/2008 | Yamaguchi et al. |
| 2009/0166684 | A1 | 7/2009 | Yahav et al. |
| 2009/0278223 | A1 | 11/2009 | Ishikawa et al. |
| 2010/0140668 | A1* | 6/2010 | Stevens .............. H01L 27/1463 257/225 |
| 2010/0148297 | A1 | 6/2010 | Kurita |
| 2011/0089513 | A1 | 4/2011 | Endo |
| 2011/0147879 | A1 | 6/2011 | Tivarus |
| 2011/0163407 | A1 | 7/2011 | Yuzurihara et al. |
| 2011/0206590 | A1 | 8/2011 | Honda et al. |
| 2011/0227138 | A1* | 9/2011 | Haddad ............ H01L 27/14625 257/291 |
| 2012/0021558 | A1 | 1/2012 | Kurita |
| 2012/0080766 | A1 | 4/2012 | Chang et al. |
| 2013/0215300 | A1 | 8/2013 | Kobayashi et al. |
| 2014/0374861 | A1* | 12/2014 | Hoshi .................... H01L 29/36 257/431 |

FOREIGN PATENT DOCUMENTS

| | | |
|---|---|---|
| DE | 11 2012 003 985 T5 | 8/2014 |
| EP | 0 023 656 A1 | 2/1981 |
| EP | 1 542 286 A2 | 6/2005 |
| GB | 2 326 977 A | 1/1999 |
| JP | 6-036979 A | 2/1994 |
| JP | 6-338507 A | 12/1994 |
| JP | 7-038140 A | 2/1995 |
| JP | 2535701 B2 | 9/1996 |
| JP | 2003-092301 A | 3/2003 |
| JP | 2005-123449 A | 5/2005 |
| JP | 2005-197674 A | 7/2005 |
| JP | 2005-260177 A | 9/2005 |
| JP | 2005-322712 A | 11/2005 |
| JP | 2007-134581 A | 5/2007 |
| JP | 2007-141937 A | 6/2007 |
| JP | 2007-189110 A | 7/2007 |
| JP | 2007-251074 A | 9/2007 |
| JP | 2008-506261 A | 2/2008 |
| JP | 2008-091781 A | 4/2008 |
| JP | 2008-109143 A | 5/2008 |
| JP | 2010-034195 A | 2/2010 |
| JP | 2010-087187 A | 4/2010 |
| JP | 2010-087369 A | 4/2010 |
| JP | 2010-109382 A | 5/2010 |
| JP | 2010-165772 A | 7/2010 |
| JP | 2010-182976 A | 8/2010 |
| JP | 2011-086840 A | 4/2011 |
| JP | 2012-059849 A | 3/2012 |
| JP | 2013-089858 A | 5/2013 |
| JP | 2013-145853 A | 7/2013 |
| JP | 2013-171888 A | 9/2013 |
| JP | 2013-197373 A | 9/2013 |
| JP | 2014-078667 A | 5/2014 |
| JP | 2014-99454 A | 5/2014 |
| KR | 10-2004-0059943 A | 7/2004 |
| KR | 10-0868643 B1 | 11/2008 |
| TW | 201036152 A | 10/2010 |
| WO | 2005/108656 A1 | 11/2005 |
| WO | 2006/014457 A1 | 2/2006 |
| WO | 2007/083654 A1 | 7/2007 |
| WO | 2009/075257 A1 | 6/2009 |

OTHER PUBLICATIONS

Extended European Search Report in European Application No. 16172095.8 (dated Jul. 26, 2017).
Notification of Reasons for Refusal in Japanese Patent Application No. 2016-054470 (dated Oct. 26, 2018).
Rejection Decision in Japanese Application No. 2016-054470 (dated May 17, 2019).
First Office Action in Chinese Application No. 201610407002.1 (dated Feb. 2, 2019).

* cited by examiner

FIG. 3
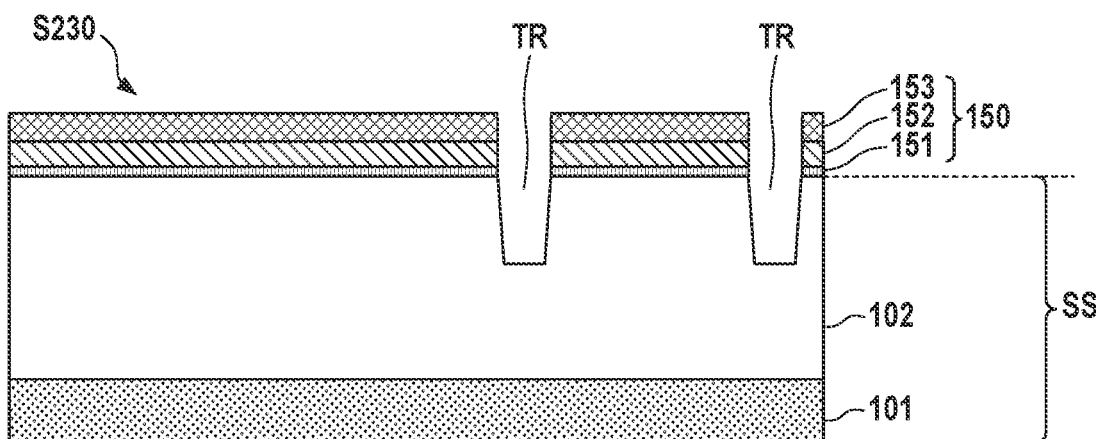
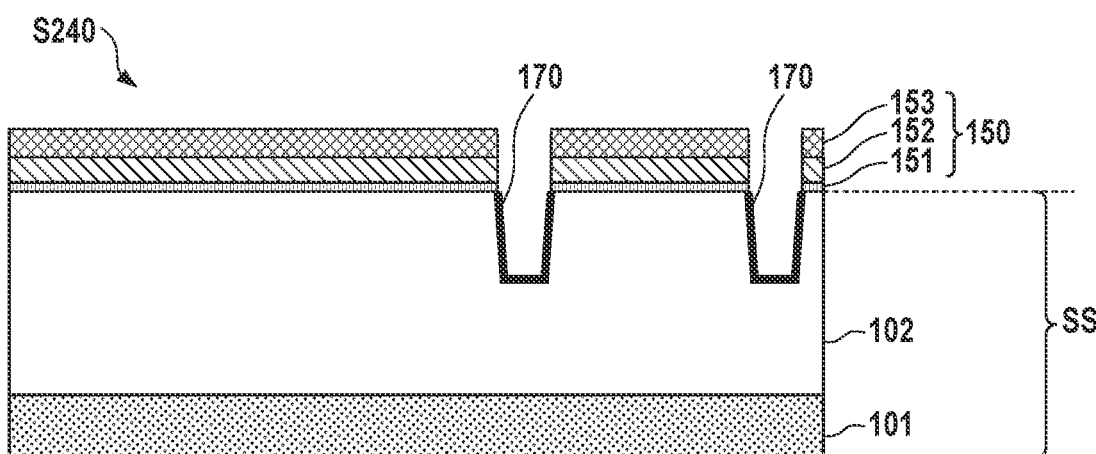
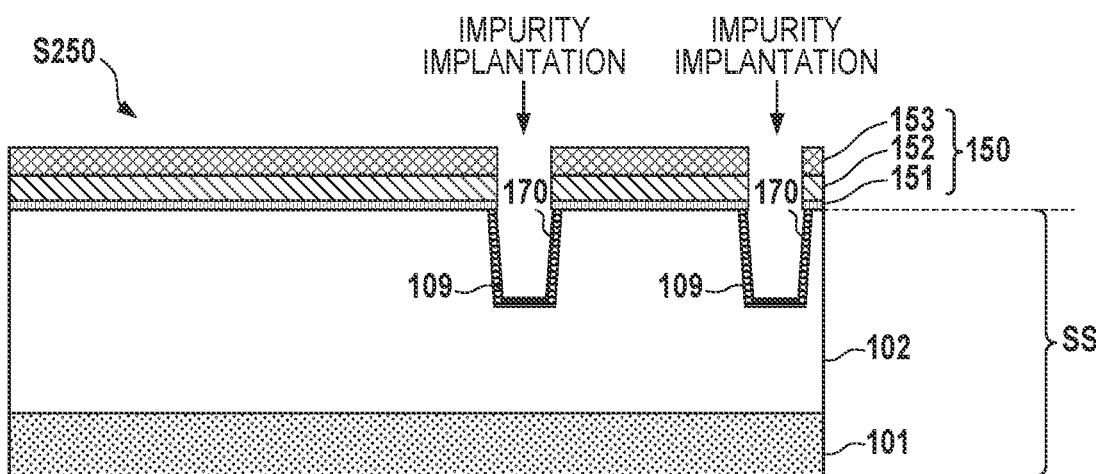

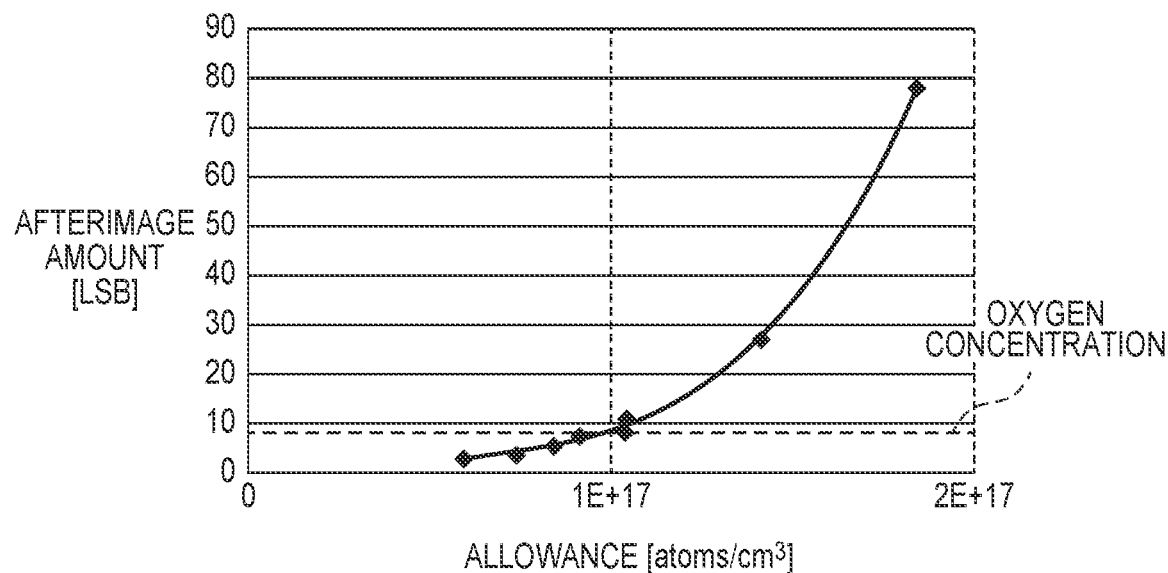

F I G. 14A
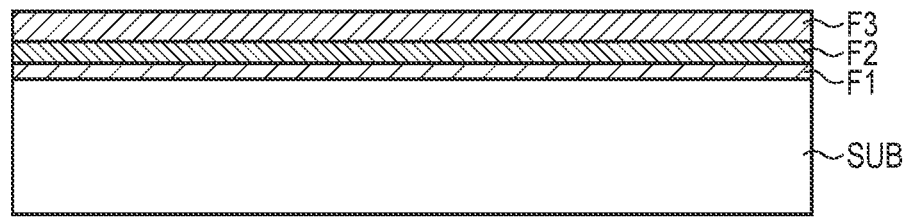
F I G. 14B
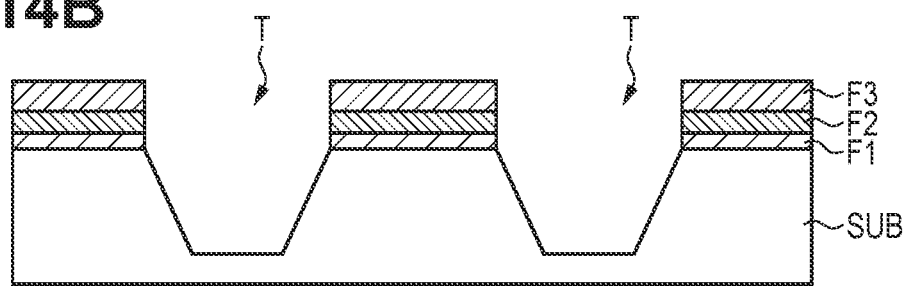
F I G. 14C
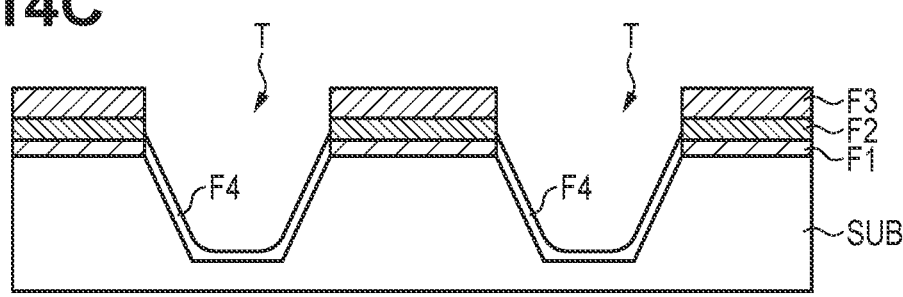
F I G. 14D
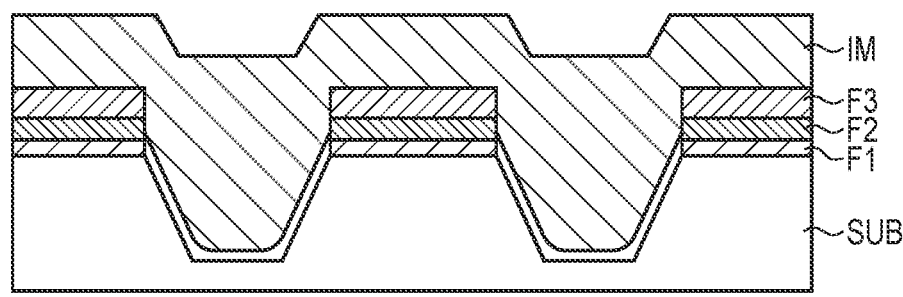

IMAGING APPARATUS, METHOD OF MANUFACTURING THE SAME, AND CAMERA

CROSS-REFERENCE TO RELATED APPLICATIONS

This application is a divisional application of U.S. patent application Ser. No. 15/170,148, filed Jun. 1, 2016, which claims the benefit of Japanese Patent Application No. 2015-119712, filed Jun. 12, 2015, Japanese Patent Application No. 2015-204674, filed Oct. 16, 2015, and Japanese Patent Application No. 2016-054470, filed Mar. 17, 2016. All prior applications are hereby incorporated by reference herein in their entirety.

BACKGROUND OF THE INVENTION

Field of the Invention

The present invention relates to an imaging apparatus, a method of manufacturing the same, and a camera.

Description of the Related Art

In an imaging apparatus, if an afterimage is generated, image quality degrades. A cause of the afterimage is the existence of oxygen in silicon. Patent literature 1 is directed to a solid-state imaging device. This literature describes that the lower is the oxygen concentration in a semiconductor substrate, the smaller is the afterimage amount.

Patent literature 1: Japanese Patent Laid-Open No. 2007-251074

In patent literature 1, examinations on afterimage suppression are not sufficient. Hence, in the solid-state imaging apparatus described in patent literature 1, an afterimage may be generated in a pixel in which the oxygen concentration is not sufficiently low.

The present invention has been made in recognition of the above-described problem, and provides a technique advantageous in suppressing generation of an afterimage.

SUMMARY OF THE INVENTION

According to a first aspect of the present invention, there is provided a method of manufacturing an imaging apparatus, comprising: preparing a substrate comprising a wafer and a silicon layer arranged on the wafer, the wafer including a first semiconductor region made of single crystal silicon with an oxygen concentration not less than $2\times10^{16}$ atoms/cm$^3$ and not greater than $4\times10^{17}$ atoms/cm$^3$, the silicon layer including a second semiconductor region made of single crystal silicon with an oxygen concentration lower than the oxygen concentration in the first semiconductor region; annealing the substrate in an atmosphere containing oxygen and setting the oxygen concentration in the second semiconductor region within the range not less than $2\times10^{16}$ atoms/cm$^3$ and not greater than $4\times10^{17}$ atoms/cm$^3$; and forming a photoelectric conversion element in the second semiconductor region after the annealing.

According to a second aspect of the present invention, there is provided an imaging apparatus including a substrate made of single crystal silicon and an element isolation part arranged on a side of a front surface of the substrate, wherein letting Cmax and Cmin respectively be a maximum value and a minimum value of an oxygen concentration in a semiconductor region of a portion at a distance not greater than 20 µm from the front surface, Cmax/Cmin is not greater than 10, and a photoelectric conversion element is arranged in the semiconductor region.

According to a third aspect of the present invention, there is provided an imaging apparatus including a pixel unit in which a plurality of pixels are arrayed on a substrate made of silicon, and a peripheral circuit unit arranged on a periphery of the pixel unit on the substrate and including a circuit configured to process a signal from each pixel, wherein the peripheral circuit unit includes a transistor including a silicide region containing at least one of nickel and cobalt, each pixel includes: a first region of a first conductivity type formed in the substrate and including a portion configured to accumulate charges generated by photoelectric conversion; a second region of the first conductivity type arranged in the substrate at a position deeper than the first region and apart from the first region; and a third region of a second conductivity type arranged between the first region and the second region in a depth direction from a surface of the substrate, the third region includes: a first portion arranged at a position apart from the second region in the depth direction and including a position at which a net concentration of an impurity of the second conductivity type exhibits a first maximal value; and a second portion arranged between the first portion and the second region in the depth direction, and an oxygen concentration in the second portion is not greater than $1\times10^{17}$ [atoms/cm$^3$].

According to a fourth aspect of the present invention, there is provided a camera comprising an imaging apparatus as specified as the second or third aspect of present invention; and a processing unit configured to process a signal output from the imaging apparatus.

Further features of the present invention will become apparent from the following description of exemplary embodiments with reference to the attached drawings.

BRIEF DESCRIPTION OF THE DRAWINGS

FIG. 3 shows sectional views for exemplarily explaining the method of manufacturing the imaging apparatus according to one embodiment of the present invention;

FIGS. 12A and 12B are views for explaining the oxygen concentration dependence in the substrate for an afterimage in an image and the determination results of an afterimage and white spot defects;

FIGS. 14A to 14D are sectional views for explaining an example of a method of forming an element isolation part;

DESCRIPTION OF THE EMBODIMENTS

Figure 1:
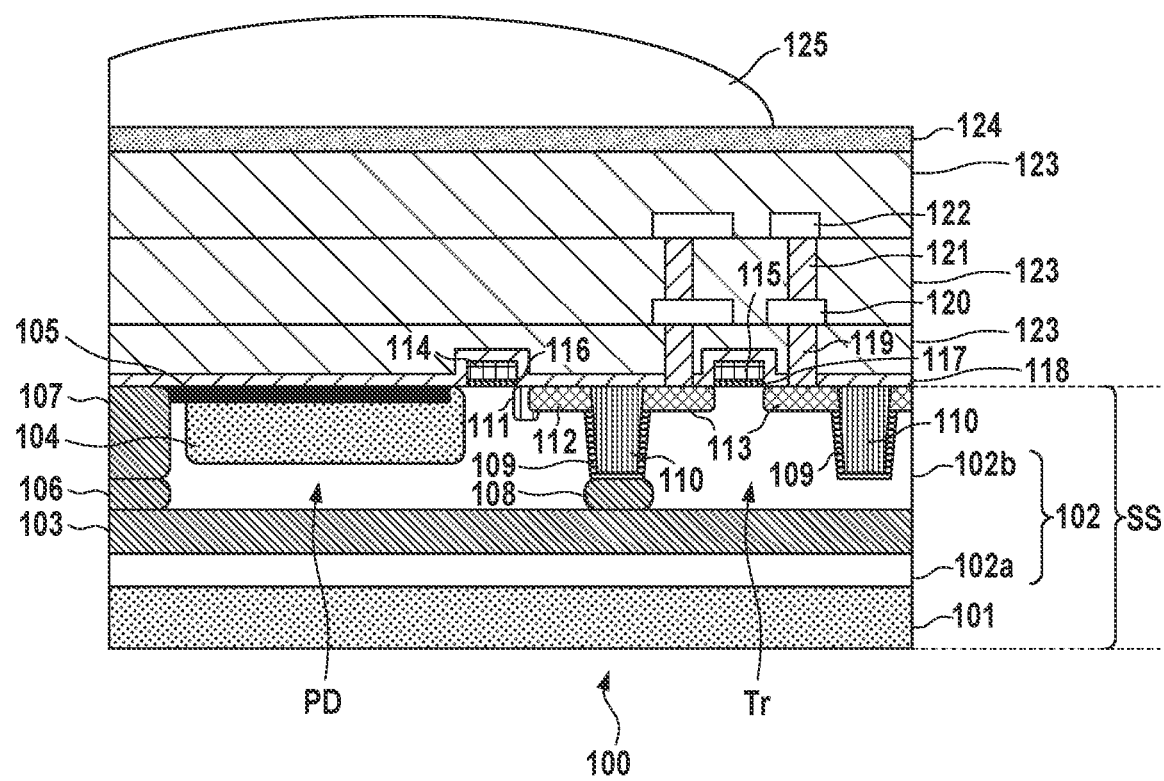
FIG. 1 is a sectional view schematically showing the sectional structure of an imaging apparatus according to one embodiment of the present invention.

The present invention will now be described with reference to the accompanying drawings by way of the first exemplary embodiment.

In this specification, a maximum value and a minimum value mean a global maximum and a global minimum, respectively, and a maximal value and a minimal value mean a local maximum value and a local minimum value, respectively.

In an imaging apparatus, if an afterimage is generated, image quality degrades. A cause of the afterimage is the existence of oxygen in silicon. Japanese Patent Laid-Open No. 2007-251074 is directed to a solid-state imaging device. Japanese Patent Laid-Open No. 2007-251074 describes that the lower the oxygen concentration in a semiconductor substrate is, the smaller the afterimage amount is. As a detailed example, Japanese Patent Laid-Open No. 2007-251074 describes forming a photodiode on a silicon substrate in which the oxygen concentration ranges from $13.3 \times 10^{17}$ to $13.7 \times 10^{17}$ atoms/cm$^3$. Japanese Patent Laid-Open No. 2010-34195 is directed to a silicon wafer such as an epitaxial wafer. Japanese Patent Laid-Open No. 2010-34195 describes obtaining a silicon wafer having a dissolved oxygen concentration distribution with maximum and minimum values at a fixed depth by performing, for a wafer, rapid thermal annealing in an oxygen gas atmosphere.

If the gradient of the oxygen concentration in the depth direction of the semiconductor substrate used to form the imaging apparatus is large, the degree of diffusion of oxygen may vary due to a process error in the manufacturing stage. This may cause a variation in the oxygen concentration between a plurality of manufactured imaging apparatuses. In addition, an afterimage may be generated in individuals in which the oxygen concentration is not sufficiently low. Alternatively, an oxygen concentration distribution may be generated between pixels in an imaging apparatus. In addition, an afterimage may be generated in pixels in which the oxygen concentration is not sufficiently low.

This embodiment has been made in recognition of the above-described problem, and has as its object to provide a technique advantageous in suppressing generation of an afterimage.

According to an aspect of this embodiment, there is provided a method of manufacturing an imaging apparatus, comprising steps of:

(a) preparing a semiconductor substrate including a first semiconductor region made of single crystal silicon with an oxygen concentration within a range of $2 \times 10^{16}$ atoms/cm$^3$ (inclusive) to $4 \times 10^{17}$ atoms/cm$^3$ (inclusive), and a second semiconductor region arranged on the first semiconductor region and made of single crystal silicon with an oxygen concentration lower than the oxygen concentration in the first semiconductor region;

(b) annealing the semiconductor substrate in an atmosphere containing oxygen and setting the oxygen concentration in the second semiconductor region within the range of $2 \times 10^{16}$ atoms/cm$^3$ (inclusive) to $4 \times 10^{17}$ atoms/cm$^3$ (inclusive); and (c) forming a photoelectric conversion element in the second semiconductor region.

According to this embodiment, there is provided a technique advantageous in suppressing generation of an afterimage.

In the following description, "first conductivity type" and "second conductivity type" are terms used to distinguish between conductivity types. If the first conductivity type is an n type, the second conductivity type is a p type. Conversely, if the first conductivity type is a p type, the second conductivity type is an n type.

FIG. 1 schematically shows the sectional structure of an imaging apparatus 100 according to one embodiment of the present invention. The imaging apparatus 100 is a solid-state imaging apparatus having a semiconductor substrate SS including a first semiconductor region 101 and a second semiconductor region 102 arranged on the first semiconductor region 101. One of two surfaces of the second semiconductor region 102 opposite to the first semiconductor region 101 forms the surface of the semiconductor substrate SS. The back surface of the semiconductor substrate SS can be formed by the first semiconductor region 101. The second semiconductor region 102 continues from the first semiconductor region 101. That is, no insulating region exists between the first semiconductor region 101 and the second semiconductor region 102. In this example, both the first semiconductor region 101 and the second semiconductor region 102 have the first conductivity type. That is, in this example, the first semiconductor region 101 and the second semiconductor region 102 have the same conductivity type. The first semiconductor region 101 and the second semiconductor region 102 may have different conductivity types. A plurality of impurity regions whose conductivity types or impurity concentrations are different from each other are provided in the second semiconductor region 102, as will be described later.

The concentration of the impurity of the first conductivity type in the first semiconductor region 101 is different from the concentration of the impurity of the first conductivity type in the second semiconductor region 102. In an example, the concentration of the impurity of the first conductivity type in the first semiconductor region 101 is higher than the concentration of the impurity of the first conductivity type in the second semiconductor region 102. In another example, the concentration of the impurity of the first conductivity type in the first semiconductor region 101 is lower than the concentration of the impurity of the first conductivity type in the second semiconductor region 102.

The first semiconductor region 101 is made of single crystal silicon, and can be formed by slicing a single crystal silicon ingot and grinding the slice. The second semiconductor region 102 is made of single crystal silicon, and can be formed by forming a single crystal silicon layer on the first semiconductor region 101 epitaxial growth. The layer formed by epitaxial growth is called an epitaxial layer. Since a crystal lattice can continue between the first semiconductor region 101 and the second semiconductor region 102, it may be impossible to observe a clear interface.

A photoelectric conversion element PD is arranged in the semiconductor substrate SS of the imaging apparatus 100. The photoelectric conversion element PD is arranged in at least the first semiconductor region 101. In this example, the photoelectric conversion element PD is arranged in the first semiconductor region 101. However, the impurity region can be extended to the second semiconductor region 102. The photoelectric conversion element PD includes an impurity region 104 of the first conductivity type capable of functioning as a charge accumulation region. In the impurity region 104 of the first conductivity type, signal charges form the majority carrier. The photoelectric conversion element PD can also include, between the impurity region 104 and the first semiconductor region 101, an impurity region 103 having the second conductivity type different from the first conductivity type. The photoelectric conversion element PD can also include, under the impurity region 104, an impurity region 102b of the first conductivity type arranged continuously from the impurity region 104. A portion arranged under the impurity region 103 out of the second semiconductor region 102 is an impurity region 102a. A portion arranged on the impurity region 103 out of the second semiconductor region 102 is the impurity region 102b.

The concentration of the impurity of the first conductivity type in the impurity region 104 is higher than the concentration of the impurity in the second semiconductor region 102 (the impurity regions 102a and 102b). The impurity regions 104, 102b, and 103 constitute the photoelectric conversion element PD. Out of negative charges (electrons) and positive charges (holes) generated by photoelectric conversion of the photoelectric conversion element PD, charges of the same type as the majority carrier in the first conductivity type are accumulated in the impurity region 104. The photoelectric conversion element PD can include an impurity region 105 having the second conductivity type and arranged on the upper side of the impurity region 104, that is, between the impurity region 104 and the surface of the semiconductor substrate SS. The impurity region 105 functions to isolate the impurity region 104 from the surface of the semiconductor substrate SS. The photoelectric conversion element PD having a buried structure is thus constituted.

Although not illustrated, the imaging apparatus 100 includes a plurality of impurity regions 104. The plurality of impurity regions 104 can be isolated from each other by impurity regions 106 and 107 of the second conductivity type each functioning as an isolation region based on a potential barrier. The impurity region 103 can be arranged under the array of the plurality of impurity regions 104 so as to spread throughout the region of the array.

The imaging apparatus 100 can be formed as a MOS image sensor, a CCD image sensor, or an image sensor of any other type. An example in which the imaging apparatus 100 is formed as a MOS image sensor will be described below.

Charges accumulated in the impurity region 104 are transferred to an impurity region 112 of the first conductivity type functioning as a floating diffusion region via a channel that is formed in the impurity region 102b when a potential of active level is applied to a gate electrode 114 (transfer gate). The impurity region 112 is formed between the surface of the semiconductor substrate SS and the impurity region 102b out of the second semiconductor region 102. The gate electrode 114 is arranged on a gate insulating film 116 on the semiconductor substrate SS. The impurity regions 104 and 112, the gate electrode 114, and the gate insulating film 116 have a MOS transistor structure. An impurity region 111 functioning as a field relaxation region can be arranged on a side of the impurity region 112 close to the impurity region 104. The impurity region 111 can have the first conductivity type.

The imaging apparatus 100 can include a plurality of transistors Tr to output, to a column signal line, a signal corresponding to the charges transferred to the impurity region 112. The plurality of transistors Tr are arranged on the surface side of the semiconductor substrate SS. Each transistor Tr can include impurity regions 113 that form a source and a drain, a gate electrode 115, and a gate insulating film 117. Out of elements including the plurality of transistors Tr and impurity regions 104 (photoelectric conversion elements), elements to be isolated can be isolated by an element isolation part 110. The element isolation part 110 can be formed by an insulator having an STI structure or LOCOS structure formed on the surface side of the semiconductor substrate SS. However, the element isolation part 110 can also be formed by a p-n junction isolation. An impurity region 109 of the second conductivity type is formed around the element isolation part 110. The impurity region 109 can function as a channel stop or a shield to a dark current generated in the interface between the element isolation part 110 and the second semiconductor region 102. An impurity region 108 having the second conductivity type can be arranged between the impurity region 109 and the impurity region 103.

An insulating layer 118, a plurality of insulating layers 123, interconnection layers 120 and 122, a contact plug 119, a via plug 121, and the like can be arranged on the semiconductor substrate SS. The insulating layer 118 can function as, for example, an antireflection film and/or an etching stopper. The plurality of insulating layers 123 can function as interlayer dielectric films. A color filter layer 124, a microlens 125, and the like can be arranged on the plurality of insulating layers 123.

A method of manufacturing the imaging apparatus 100 will exemplarily be described below with reference to FIGS. 2 to 5. In step S200 shown in FIG. 2, first, a preparation step of preparing the semiconductor substrate SS is executed. The semiconductor substrate SS includes the first semiconductor region 101 having the first conductivity type and the second semiconductor region 102 arranged on the first semiconductor region 101 and having the first conductivity type. The first semiconductor region 101 can be, for example, a single crystal silicon substrate. In a more detailed example, the first semiconductor region 101 can be a single crystal silicon wafer obtained by mirror-grinding the major surface of a disc member cut out from a single crystal silicon ingot that is pulled by the magnetic field applied CZ (Czochralski) method (MCZ method) and having a diameter of 300 mm.

The preparation step executed in step S200 can include a step of preparing the first semiconductor region 101, and a step of forming the second semiconductor region 102 on the first semiconductor region 101. The second semiconductor region 102 can be formed on the first semiconductor region 101 typically by epitaxial growth. For example, each of the first semiconductor region 101 and the second semiconductor region 102 contains, as an impurity, phosphorus at a concentration of about $1\times10^{14}$ to $5\times10^{14}$ atoms/cm$^3$, thereby exhibiting an n type.

The oxygen concentration in the first semiconductor region 101 can fall within the range of $2\times10^{16}$ atoms/cm$^3$ (inclusive) to $4\times10^{17}$ atoms/cm$^3$ (inclusive), for example, can be $1\times10^{17}$ atoms/cm$^3$. The oxygen concentration falling within this range means that a minimum value C10min of the oxygen concentration in the first semiconductor region 101 is $2\times10^{16}$ atoms/cm$^3$ or more, and a maximum value C10max of the oxygen concentration in the first semiconductor region 101 is $4\times10^{17}$ atoms/cm$^3$ or less. The oxygen concentration can be obtained from a conversion factor by, for example, Old ASTM. There is no restriction concerning the dimensions, resistivity, and conductivity type of the first semiconductor region 101. The oxygen concentration in the second semiconductor region 102 is lower than that in the first semiconductor region 101. For example, a minimum value C20min of the oxygen concentration in the second semiconductor region 102 is smaller than the maximum value C10max of the oxygen concentration in the first semiconductor region 101 (C20min<C10max). In addition, the minimum value C20min of the oxygen concentration in the second semiconductor region 102 is smaller than the minimum value C10min of the oxygen concentration in the first semiconductor region 101 (C20min<C10min). For example, a maximum value C20max of the oxygen concentration in the second semiconductor region 102 is smaller than the maximum value C10max of the oxygen concentration in the first semiconductor region 101. In addition, the maximum value C20max of the oxygen concentration in the second semiconductor region 102 is smaller than the minimum value C10min of the oxygen concentration in the first semiconductor region 101. The second semiconductor region 102 has the same conductivity type as the first semiconductor region 101, and can have a thickness within the range of, for example, 5 μm (inclusive) to 50 μm (inclusive), more appropriately, within the range of 5 μm (inclusive) to 25 μm (inclusive).

The second semiconductor region 102 can be formed such that the concentration of the impurity of the first conductivity type in the first semiconductor region 101 becomes different from the concentration of the impurity of the first conductivity type in the second semiconductor region 102. In one example, the second semiconductor region 102 can be formed such that the concentration of the impurity of the first conductivity type in the first semiconductor region 101 becomes higher than the concentration of the impurity of the first conductivity type in the second semiconductor region 102. In another example, the second semiconductor region 102 can be formed such that the concentration of the impurity of the first conductivity type in the first semiconductor region 101 becomes lower than the concentration of the impurity of the first conductivity type in the second semiconductor region 102.

Figure 6:
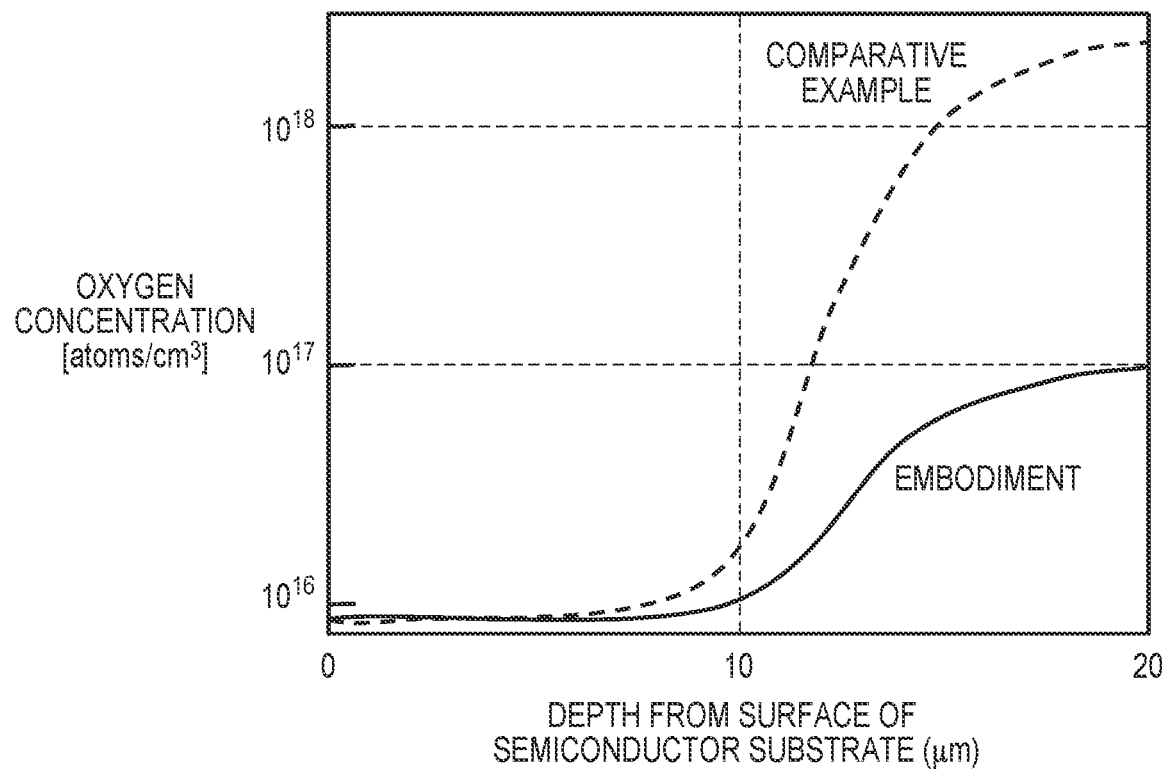
FIG. 6 is a graph showing oxygen concentration distributions in the depth direction of a semiconductor substrate according to the embodiment and a comparative example (before execution of an annealing step)

In FIG. 6, a solid line indicates the oxygen concentration distribution in the depth direction of the semiconductor substrate SS. The abscissa represents the depth from the surface of the semiconductor substrate SS, and the ordinate represents the oxygen concentration (atoms/cm$^3$). The solid line (embodiment) in FIG. 6 indicates the oxygen concentration distribution in the semiconductor substrate SS obtained by forming the second semiconductor region 102 on the first semiconductor region 101 having an oxygen concentration of $1\times10^{17}$ atoms/cm$^3$. A comparative example indicated by a dotted line in FIG. 6 shows the oxygen concentration distribution in the semiconductor substrate obtained by forming the second semiconductor region 102 on the first semiconductor region 101 having an oxygen concentration of $1.3\times10^{18}$ atoms/cm$^3$. Note that in both the embodiment and the comparative example shown in FIG. 6, the thickness of the second semiconductor region 102 that is a single crystal silicon layer formed by epitaxial growth is 9 μm. Hence, a position 9 μm deep from the surface of the semiconductor substrate corresponds to the boundary between the first semiconductor region 101 and the second semiconductor region 102. In both the embodiment indicated by the solid line and the comparative example indicated by the dotted line, the oxygen concentration in a portion (depth: 0 to 4.5 μm) from the surface of the semiconductor substrate to a ½ depth out of the second semiconductor region 102 is $1\times10^{16}$ atoms/cm$^3$ or less. In this embodiment, even in the remaining portion (depth: 4.5 to 9 μm) out of the second semiconductor region 102, the oxygen concentration is $1\times10^{16}$ atoms/cm$^3$ or less. In the comparative example, in the remaining portion (depth: 4.5 to 9 μm) out of the second semiconductor region 102, the oxygen concentration exceeds $1\times10^{16}$ atoms/cm$^3$ because of oxygen diffusion from the first semiconductor region 101.

Figure 2:
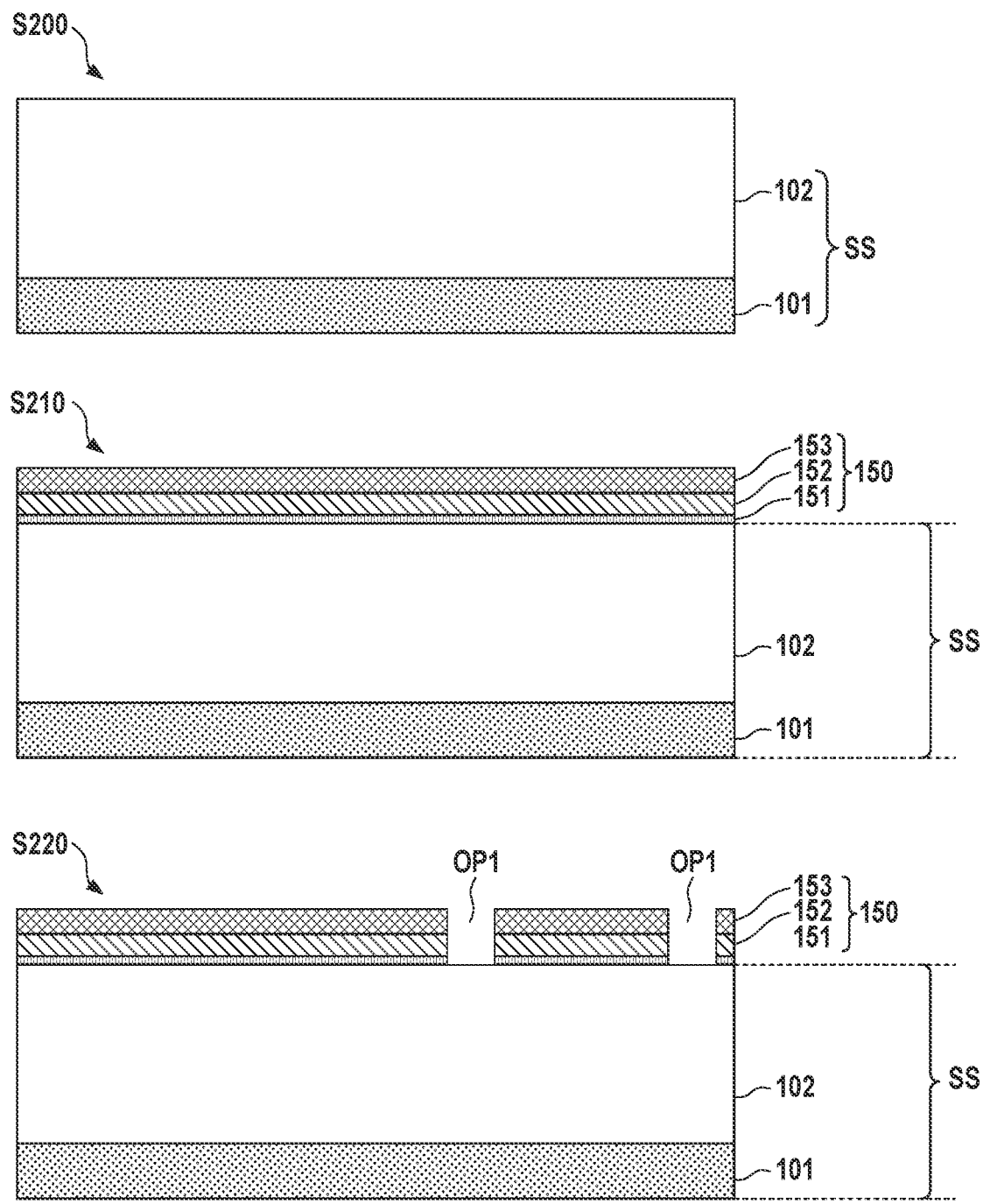
FIG. 2 shows sectional views for exemplarily explaining a method of manufacturing the imaging apparatus according to one embodiment of the present invention.

Next, in steps S210 and S220 shown in FIG. 2 and step S230 shown in FIG. 3, a trench formation step of forming trenches TR in the semiconductor substrate SS is executed. First, in step S210, a step of forming a film 150 on the semiconductor substrate SS is executed. The film 150 can include, for example, a silicon oxide layer 151, a polysilicon layer 152 arranged on the silicon oxide layer 151, and a silicon nitride layer 153 arranged on the polysilicon layer 152. In step S220 next to step S210, a step of forming openings OP1 by patterning the film 150 using lithography is executed. In step S230 next to step S220, a step of etching the semiconductor substrate SS (second semiconductor region 102) via the openings OP1 using the patterned film 150 as an etching mask is executed. With this step, the trenches TR are formed in the semiconductor substrate SS (second semiconductor region 102).

Next, in step S240 shown in FIG. 3, the semiconductor substrate SS is annealed in an atmosphere containing oxygen. When the trenches TR are formed, the oxygen can be supplied from the inner surfaces of the trenches TR to a deep portion of the second semiconductor region 102. Oxidation of the inner surfaces of the trenches TR occurs in association with this annealing. As a result, a silicon oxide film 170 can be formed on the inner surface of each trench TR. The annealing of step S240 can be executed at a temperature of, for example, 800° C. (inclusive) to 1,150° C. (inclusive). Additionally, the annealing of step S240 can be executed such that, for example, the oxygen concentration in the second semiconductor region 102 falls within the range of $2\times10^{16}$ atoms/cm$^3$ (inclusive) to $4\times10^{17}$ atoms/cm$^3$ (inclusive). Alternatively, the annealing of step S240 can be executed such that, for example, the oxygen concentration in the second semiconductor region 102 falls within the range of $1\times10^{16}$ atoms/cm$^3$ (inclusive) to $1\times10^{17}$ atoms/cm$^3$ (inclusive).

The solubility limit concentration of oxygen in silicon at a temperature of 800° C. (inclusive) to 1,150° C. (inclusive) falls within the range of $2\times10^{16}$ atoms/cm$^3$ (inclusive) to $4\times10^{17}$ atoms/cm$^3$ (inclusive) The oxygen concentration in the first semiconductor region 101 used to obtain the semiconductor substrate SS is preferably set to a concentration within the range of the solubility limit concentration, and the annealing of step S240 is preferably executed in an atmosphere containing oxygen. According to this method, it is possible to easily obtain the semiconductor substrate SS having an almost constant oxygen concentration distribution in the depth direction.

Wholly in the depth direction of the second semiconductor region 102, the oxygen concentration in the second semiconductor region 102 can be set within the range of $2\times10^{16}$ atoms/cm$^3$ (inclusive) to $4\times10^{17}$ atoms/cm$^3$ (inclusive) by executing the annealing of step S240. Additionally, wholly in the depth direction of the second semiconductor region 102, the oxygen concentration in the second semiconductor region 102 can be set within the range of $1\times10^{16}$ atoms/cm$^3$ (inclusive) to $1\times10^{17}$ atoms/cm$^3$ (inclusive). For example, letting C21max and C21min respectively be the maximum value and the minimum value of the oxygen concentration in the second semiconductor region 102 after step S240, C21max/C21min is preferably 10 or less. More preferably, C21max/C21min is 5 or less.

Figure 7:
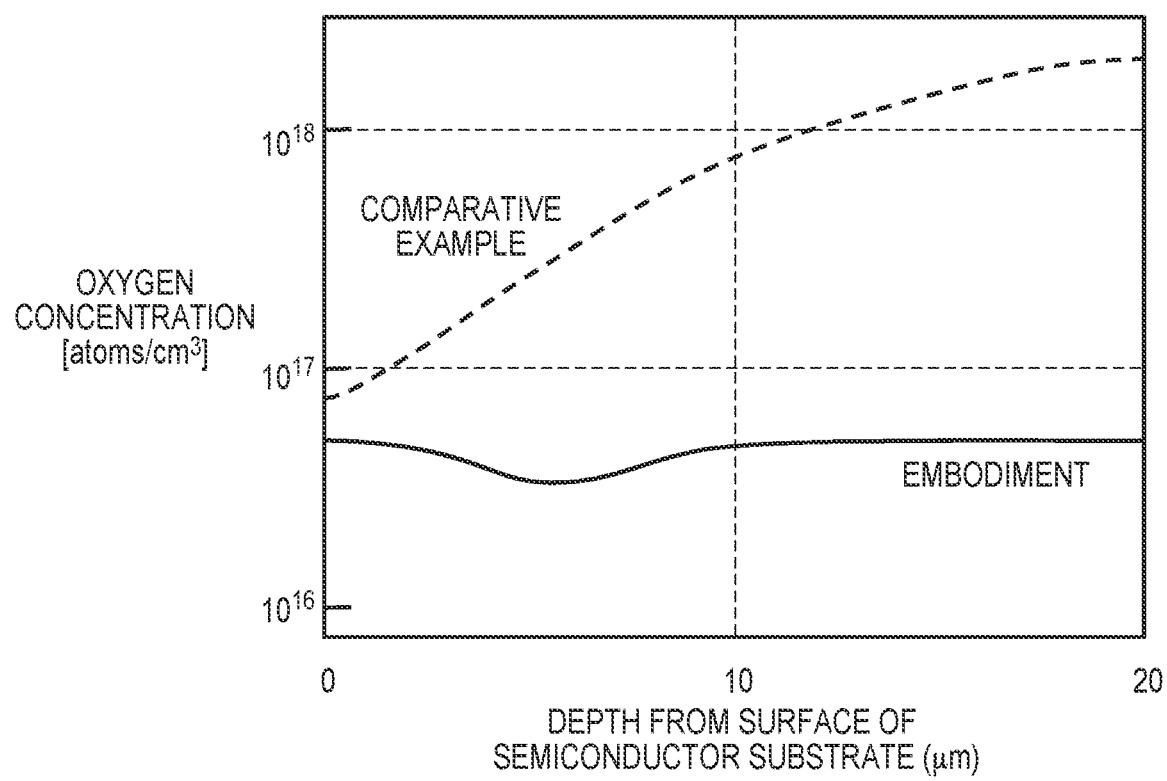
FIG. 7 is a graph showing oxygen concentration distributions in the depth direction of the semiconductor substrate according to the embodiment and the comparative example (after execution of an annealing step in an atmosphere containing oxygen)

In FIG. 7, a solid line indicates the oxygen concentration distribution in the depth direction of the semiconductor substrate SS after the annealing has been executed in the atmosphere containing oxygen in step S240. The result shown in FIG. 7 is a result obtained by setting the temperature of the annealing step in step S240 to 1,050° C.

In the annealing of step S240, the semiconductor substrate SS is heated and then forcibly cooled, thereby rapidly cooling the semiconductor substrate SS. In this cooling, the temperature of the semiconductor substrate SS can drop at a temperature drop rate of, for example, 0.1° C./sec or more, preferably at a temperature drop rate of 1° C./sec or more, and more preferably at a temperature drop rate of 10° C./sec or more. The temperature drop rate can be 100° C./sec or less. Unwanted oxygen diffusion can be suppressed by the rapid cooling.

Figure 4:
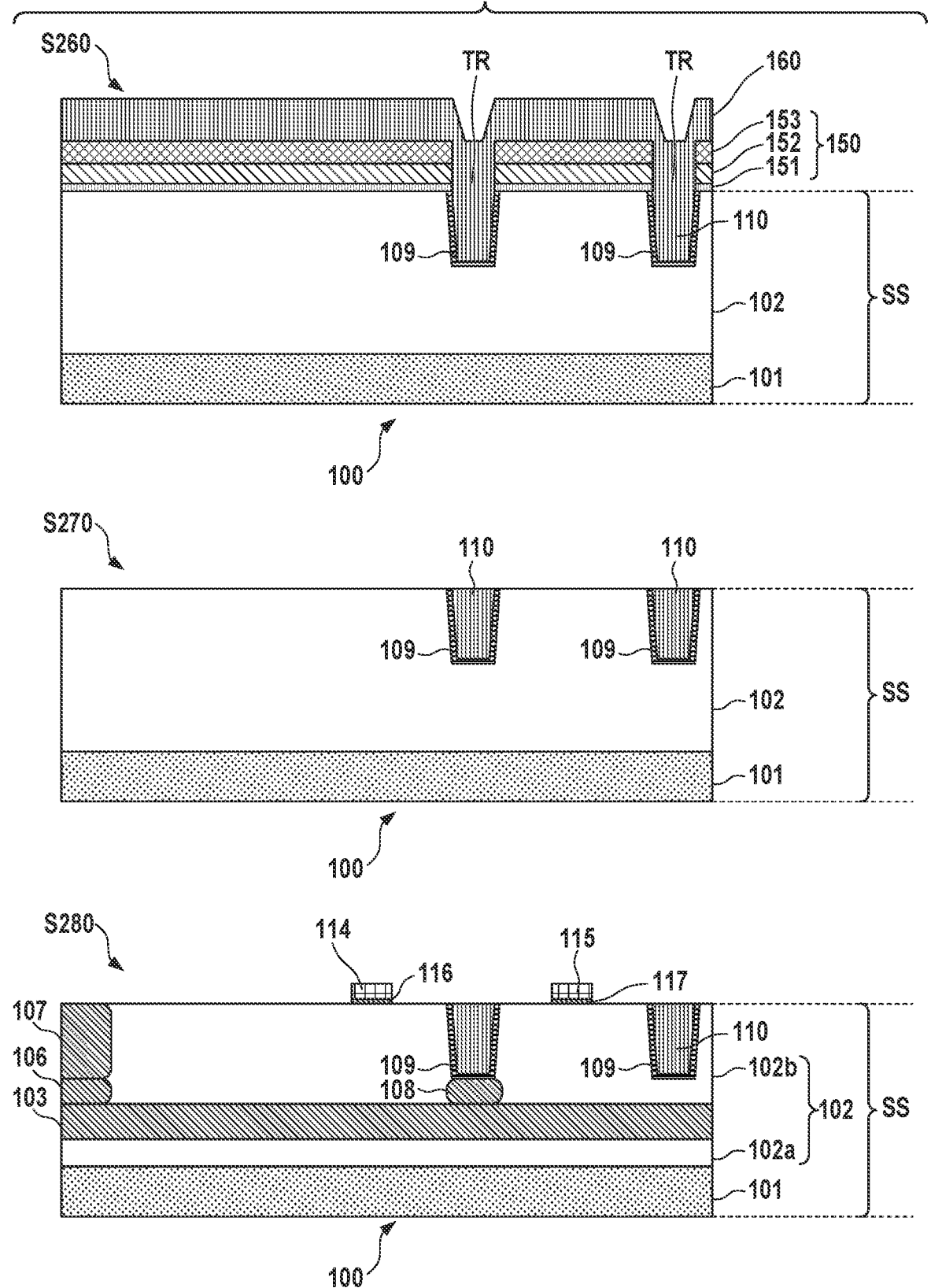
FIG. 4 shows sectional views for exemplarily explaining the method of manufacturing the imaging apparatus according to one embodiment of the present invention.
Figure 5:
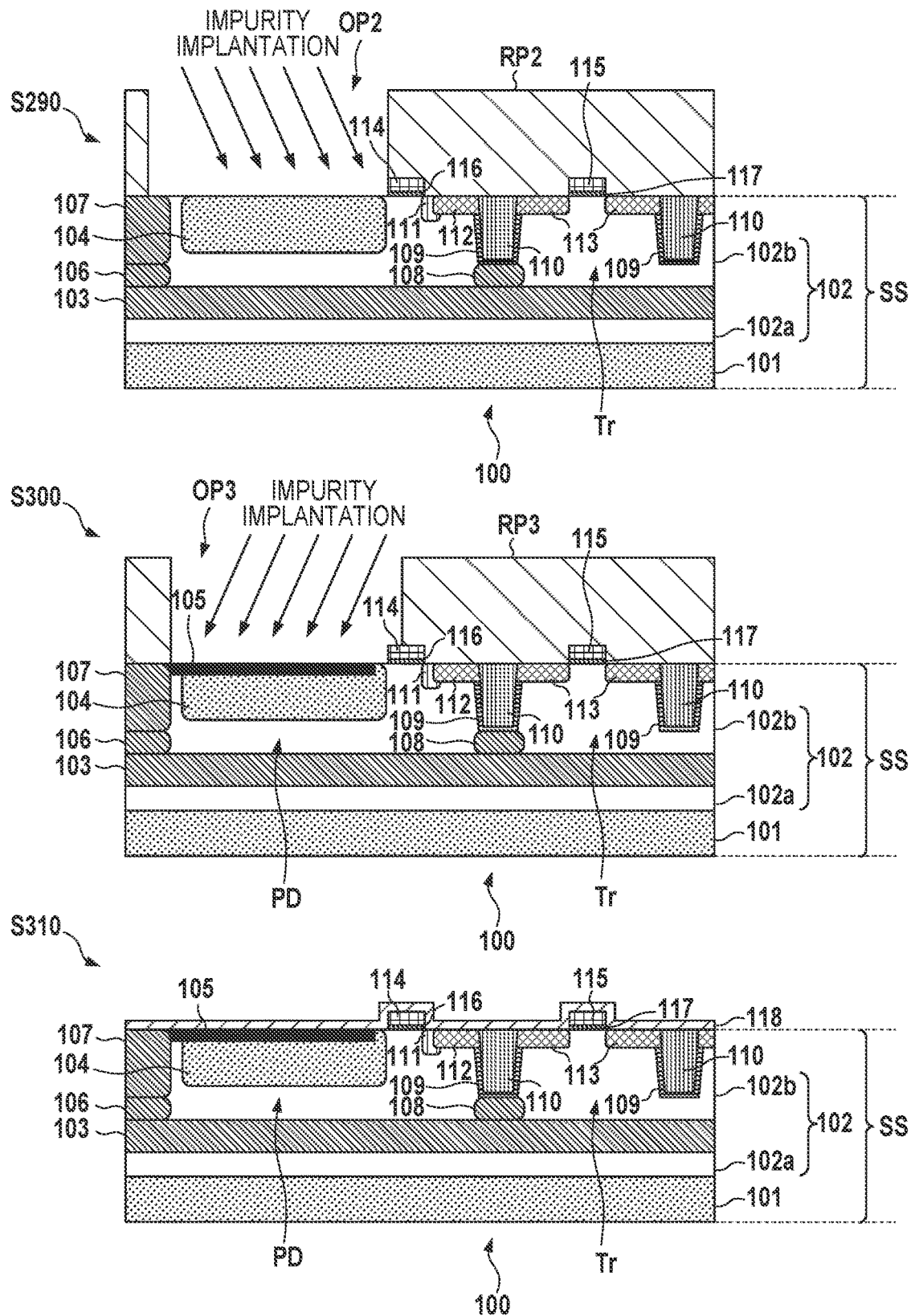
FIG. 5 shows sectional views for exemplarily explaining the method of manufacturing the imaging apparatus according to one embodiment of the present invention.

Next, in step S250 shown in FIG. 3, an implantation step of forming the impurity regions 109 of the second conductivity type is executed. When the impurity region 109 is formed along the inner surface of each trench TR, a dark current generated near the inner surface of the trench TR can be reduced. The annealing of step S240 may be executed after formation of the impurity regions 109. However, when the formation of the impurity regions 109 is performed after the annealing of step S240, unwanted diffusion in the impurity regions 109 can be suppressed. Next, in step S260 shown in FIG. 4, a filling step of filling the trenches TR with an insulator 160 (silicon oxide) is executed. At this time, the insulator 160 can be deposited even on the film 150. FIG. 4 shows the silicon oxide films 170 integrally with the insulator 160. Next, in step S270 shown in FIG. 4, a removal step of removing the insulator 160 on the film 150 by CMP or the like is executed. The element isolation parts 110 are thus formed in the trenches TR. After that, the film 150 is removed. The annealing in the oxygen atmosphere in step S240 may be executed after the burying of the insulator 160 in step S260. However, when the annealing in the oxygen atmosphere is performed before the burying of the insulator 160, the oxygen can be supplied from the inner surfaces of the trenches TR to a deep portion of the second semiconductor region 102.

Next, in step S280 shown in FIG. 4, the impurity region 103 of the second conductivity type and the impurity regions 106 and 107 of the second conductivity type are formed. Note that a resist pattern used to form the impurity region 103 of the second conductivity type and the impurity regions 106 and 107 of the second conductivity type is omitted.

Then, to diffuse or activate the formed impurity regions 103, 106, and 107 of the second conductivity type, the annealing step is performed in an atmosphere that does not contain oxygen. After that, in step S280, the gate insulating films 116 and 117 and the gate electrodes 114 and 115 are formed on the semiconductor substrate SS.

Figure 8:
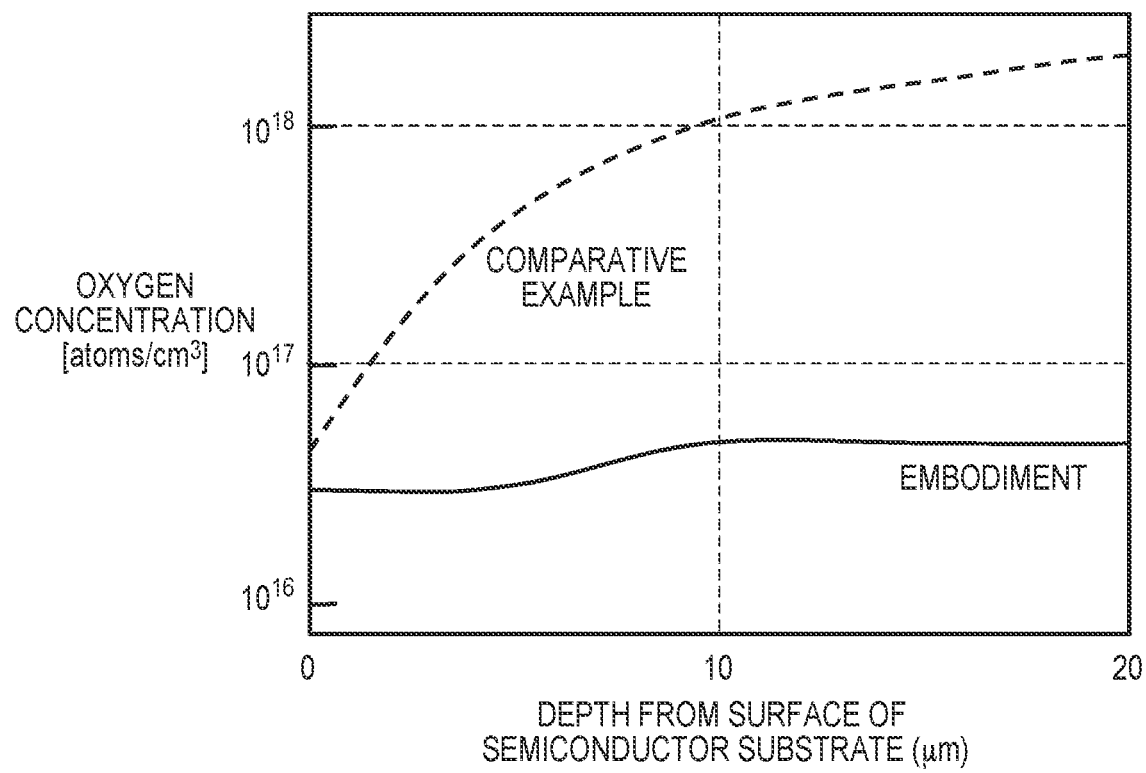
FIG. 8 is a graph showing oxygen concentration distributions in the depth direction of the semiconductor substrate according to the embodiment and the comparative example (after execution of an annealing step in an atmosphere containing oxygen and an annealing step in an atmosphere that does not contain oxygen)

In FIG. 8, a solid line indicates the oxygen concentration distribution in the depth direction of the semiconductor substrate SS after step S280. In the state shown in FIG. 8, the above-described annealing step in the atmosphere that does not contain oxygen and an annealing step in an atmosphere containing oxygen to form the gate insulating films 116 and 117 have ended. When the annealing step is executed in the atmosphere that does not contain oxygen, oxygen in a region of the semiconductor substrate SS close to the surface is eliminated by out diffusion. For this reason, as compared to a state immediately after the annealing step in step S240 (FIG. 7), the concentration of oxygen lowers in the region of the semiconductor substrate SS close to the surface. As can be understood from the result shown in FIG. 8, the gradient of the oxygen concentration is suppressed within an allowance even by annealing (annealing for activating the implanted impurity or deposition processing) executable after step S240. Wholly in the depth direction of the second semiconductor region 102, the oxygen concentration in the second semiconductor region 102 can be maintained within the range of $2\times10^{16}$ atoms/cm$^3$ (inclusive) to $4\times10^{17}$ atoms/cm$^3$ (inclusive) even after step S280. Additionally, wholly in the depth direction of the second semiconductor region 102, the oxygen concentration in the second semiconductor region 102 can be maintained within the range of $1\times10^{16}$ atoms/cm$^3$ (inclusive) to $1\times10^{17}$ atoms/cm$^3$ (inclusive). For example, let C22max and C22min respectively be the maximum value and the minimum value of the oxygen concentration in the second semiconductor region 102 after step S280. Even at this time, C22max/C22min is preferably 10 or less. More preferably, C22max/C22min is 5 or less.

Next, in step S290, a resist pattern RP2 is formed on the semiconductor substrate SS. An impurity of the first conductivity type is implanted into the semiconductor substrate SS (second semiconductor region 102) via an opening OP2 of the resist pattern RP2, thereby forming the impurity region 104. After that, the resist pattern RP2 is removed.

Next, in step S300, a resist pattern RP3 is formed on the semiconductor substrate SS. An impurity of the second conductivity type is implanted into the semiconductor substrate SS via an opening OP3 of the resist pattern RP3. The impurity region 105 of the second conductivity type is thus formed on the impurity region 104. In this way, the photoelectric conversion element PD is formed in steps S200 to S300.

Next, in step S310, the insulating layer 118 is formed so as to cover the surface of the semiconductor substrate SS and the gate electrodes 114 and 115. After that, the plurality of insulating layers 123, the interconnection layers 120 and 122, the contact plug 119, the via plug 121, and the like are formed. In addition, the color filter layer 124, the microlens 125, and the like are formed. The imaging apparatus 100 as shown in FIG. 1 is thus completed.

Figure 9:
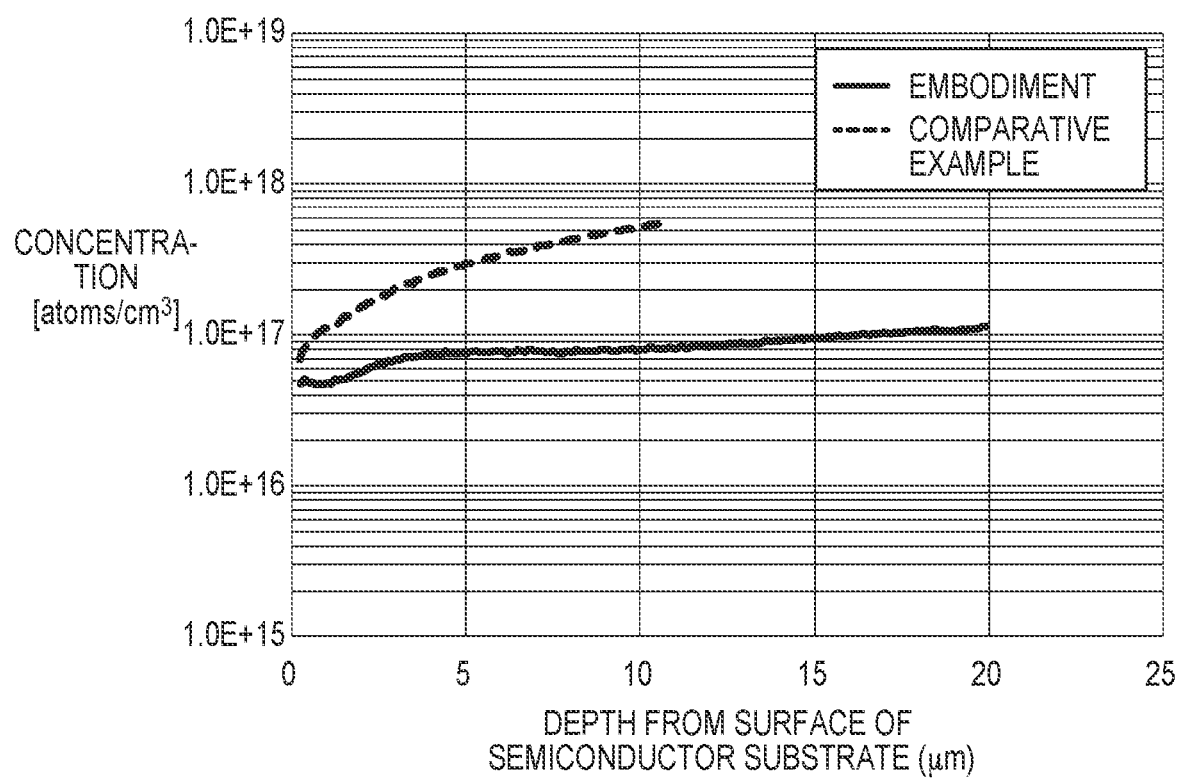
FIG. 9 is a graph showing the oxygen concentration distribution in the semiconductor substrate of a manufactured imaging apparatus.

In FIG. 9, a solid line indicates the oxygen concentration distribution in the semiconductor substrate SS of the imaging apparatus 100 manufactured according to this embodiment. FIG. 9 also shows a comparative example. In the comparative example, the oxygen concentration at a depth of about 10 m from the surface of the semiconductor substrate SS is $7\times10^{17}$ atoms/cm$^3$. This is about 10 times higher than the oxygen concentration of $7\times10^{16}$ atoms/cm$^3$ near the surface, and the concentration gradient is very large. To the contrary, in this embodiment, the oxygen concentration is $8 \times 10^{16}$ atoms/cm$^3$ even at the depth of about 10 m from the surface of the semiconductor substrate SS. This is about 1.6 times higher than the oxygen concentration of $5 \times 10^{16}$ atoms/cm$^3$ near the surface. That is, in this embodiment, a state in which the gradient of the oxygen concentration is small is achieved. In the state in which the gradient of the oxygen concentration is small, even if a variation occurs in the manufacturing process, an afterimage derived from the variations can be suppressed. An example of the variation in the manufacturing process is a variation in the oxygen concentration in the ingot used to cut out the first semiconductor region 101 or in the first semiconductor region 101. Another example of the variation in the manufacturing process is a temperature variation in annealing for activating an impurity after it is implanted into the semiconductor substrate SS or deposition processing.

In the imaging apparatus 100, letting Cmax and Cmin respectively be the maximum value and the minimum value of the oxygen concentration in a deep portion of the semiconductor substrate SS with a large influence on the afterimage, Cmax/Cmin is preferably 10 or less. For example, in the imaging apparatus 100, letting Cmax and Cmin respectively be the maximum value and the minimum value of the oxygen concentration in the semiconductor region of a portion at a distance of 20 μm or less from the surface of the semiconductor substrate SS, Cmax/Cmin is preferably 10 or less. Alternatively, in the imaging apparatus 100, letting Cmax and Cmin respectively be the maximum value and the minimum value of the oxygen concentration in the semiconductor region of a portion at a distance of 30 μm or less from the surface of the semiconductor substrate SS, Cmax/Cmin is preferably 10 or less. Otherwise, in the imaging apparatus 100, letting Cmax and Cmin respectively be the maximum value and the minimum value of the oxygen concentration in the semiconductor region of a portion at a distance of 40 μm or less from the surface of the semiconductor substrate SS, Cmax/Cmin is preferably 10 or less. Alternatively, in the imaging apparatus 100, letting Cmax and Cmin respectively be the maximum value and the minimum value of the oxygen concentration in the semiconductor region of a portion at a distance of 50 μm or less from the surface of the semiconductor substrate SS, Cmax/Cmin is preferably 10 or less. Cmax/Cmin is preferably 5 or less at each depth.

Note that letting Cmax and Cmin respectively be the maximum value and the minimum value of the oxygen concentration in a portion at a depth of 10 μm or less from the surface of the semiconductor substrate SS, the value Cmax/Cmin is 1.6 in the embodiment shown in FIG. 9 and about 10 in the comparative example shown in FIG. 9. That is, the value Cmax/Cmin of the comparative example shown in FIG. 9 is much larger than the value Cmax/Cmin of the embodiment shown in FIG. 9, and the generated afterimage amount is estimated to be large.

As an application example of the imaging apparatus according to the above-described embodiment, a camera incorporating the imaging apparatus will exemplarily be described below. The concept of the camera includes not only apparatuses mainly aiming at shooting but also apparatuses (for example, a personal computer or a portable terminal) having an auxiliary shooting function. The camera includes the imaging apparatus according to the present invention exemplarily described in the above embodiment, and a processing unit that processes a signal output from the imaging apparatus. The processing unit can include, for example, an A/D converter and a processor that processes digital data output from the A/D converter.

In the above-described embodiment, a front-illuminated CMOS image sensor has been exemplified as the imaging apparatus. However, the embodiment is applicable to a back-illuminated type and also applicable to a CCD image sensor. In a back-illuminated imaging apparatus, the thickness of a semiconductor region made of single crystal silicon and including a photoelectric conversion part is about 1 to 10 μm. Wholly in the depth direction of the semiconductor region from the front surface to the back surface, the maximum value of the oxygen concentration need only be 10 times or less of the minimum value. Wholly in the depth direction of the semiconductor region from the front surface to the back surface, the oxygen concentration need only fall within the range of $2 \times 10^{16}$ atoms/cm$^3$ (inclusive) to $4 \times 10^{17}$ atoms/cm$^3$ (inclusive). In a portion farther apart from the front surface than the back surface of the semiconductor region out of the range from the surface of the semiconductor region to a depth of 20 μm, a semiconductor region where an afterimage derived from oxygen is generated does not exist, and a microlens and a color filter can exist.

Another aspect of the present invention will be described below with reference to the accompanying drawings by way of the second embodiment as an exemplary embodiment.

An imaging apparatus includes a plurality of pixels arrayed on a substrate made of a semiconductor, for example, silicon and respectively including photoelectric conversion parts, and forms an image based on charges generated by photoelectric conversion in the pixels.

The imaging apparatus is required to suppress or reduce an afterimage and white spot defects that can be generated in an image. An afterimage can be generated if, for example, charges generated by photoelectric conversion are trapped by a defect and the like in the substrate when reading out an image, and the charges are released when reading out another image later. A white spot defect can be generated by a metal impurity mixed into the substrate, for example, in a step of siliciding the electrodes of transistors by nickel or cobalt during the manufacture of the imaging apparatus.

Japanese Patent Laid-Open No. 2007-251074 discloses suppressing an afterimage in an image by lowering the oxygen concentration in a substrate. On the other hand, Japanese Patent Laid-Open No. 2003-92301 discloses suppressing white spot defects in an image by raising the oxygen concentration in a substrate. That is, according to Japanese Patent Laid-Open Nos. 2007-251074 and 2003-92301, the substrate is required to have structures contrary to each other to achieve both afterimage suppression and white spot defect suppression. Hence, it may be said that it is difficult to achieve both by simply adjusting the oxygen concentration in the substrate.

This embodiment is directed to providing a new technique of suppressing both an afterimage and white spot defects in an image.

According to an aspect of this embodiment is directed to an imaging apparatus. The imaging apparatus includes a pixel unit in which a plurality of pixels are arrayed on a substrate made of silicon, and a peripheral circuit unit arranged on the periphery of the pixel unit on the substrate and including a circuit configured to process a signal from each pixel.

The peripheral circuit unit includes a transistor including a silicide region containing at least one of nickel and cobalt.

Each pixel includes:
a first region of a first conductivity type formed in the substrate and including a portion configured to accumulate charges generated by photoelectric conversion;
a second region of the first conductivity type arranged in the substrate at a position deeper than the first region and apart from the first region; and
a third region of a second conductivity type arranged between the first region and the second region in a depth direction from a surface of the substrate.

The third region includes:
a first portion arranged at a position apart from the second region in the depth direction and including a position at which a net concentration of an impurity of the second conductivity type exhibits a first maximal value; and
a second portion arranged between the first portion and the second region in the depth direction and including a position at which the net concentration of the impurity of the second conductivity type exhibits a second maximal value smaller than the first maximal value.

An oxygen concentration in the second portion is not greater than $1\times10^{17}$ [atoms/cm$^3$].

According to this embodiment, it is possible to suppress both an afterimage and white spot defects in an image.

(1-1. Structure of Imaging Apparatus)

Figure 10:
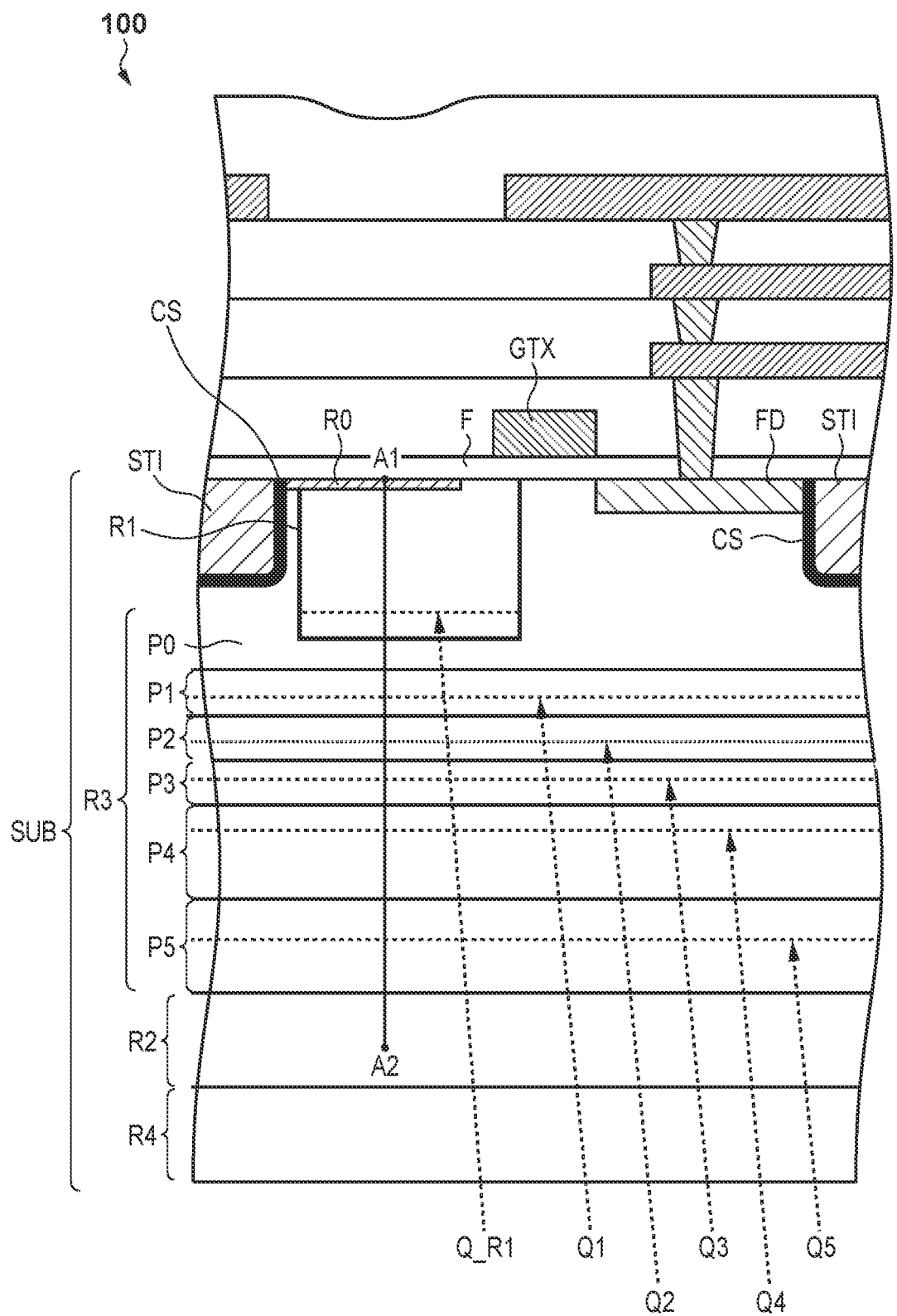
FIG. 10 is a sectional view for explaining an example of the structure of an imaging apparatus.

FIG. 10 is a schematic view for explaining an example of the structure of an imaging apparatus 100 according to the second embodiment. The imaging apparatus 100 includes regions R1 to R4 formed in a substrate SUB made of silicon. The region R1 (first region) is of, for example, an n type (first conductivity type), and will be referred to as an "n-type region R1" hereinafter in this specification. The region R2 (second region) is of, for example, an n type, and will be referred to as an "n-type region R2" hereinafter. The region R3 (third region) is of, for example, a p type (second conductivity type), and will be referred to as a "p-type region R3" hereinafter. The region R4 is of, for example, an n type, and will be referred to as an "n-type region R4" hereinafter.

Each of the regions R1 to R4 is formed using a known semiconductor manufacturing technique, for example, epitaxial growth or impurity implantation. More specifically, first, a silicon substrate corresponding to the n-type region R4 is prepared, and an n-type semiconductor member is then formed on it by, for example, epitaxial growth. Next, the n-type region R1 is formed in the formed semiconductor member by impurity implantation. Before or after formation of the n-type region R1, the p-type region R3 is formed at a position deeper than the n-type region R1. The n-type region R2 is a region between the p-type region R3 and the n-type region R4 and is therefore arranged at a position deeper than the n-type region R1 and apart from the n-type region R1.

The n-type region R1 includes a charge accumulation part (not shown) that is a portion in which charges (electrons in this example) generated by photoelectric conversion are accumulated and has an impurity concentration (for example, $1\times10^{17}$ [cm$^{-3}$] or more) higher than that of the remaining portion. The n-type region R1 may be formed at a position spaced apart from the surface of the substrate SUB (so as to be buried) by forming a p-type region R0 near the surface of the substrate SUB.

The p-type region R3 is a region formed between the n-type region R1 and the n-type region R2 so as to come into contact with the bottom surface and side surfaces of the n-type region R1. That is, a p-n junction is formed between the n-type region R1 and the p-type region R3, and a photodiode is formed. In other words, the p-type region R3 is formed from the n-type region R1 or a position shallower than the n-type region R1 to a position deeper than the n-type region R1 and shallower than the n-type region R2 so as to be adjacent to the n-type region R1.

Note that in the above-described regions, for example, boron (B) or the like is used as an impurity (p-type impurity) to form a p type and, for example, phosphorus (P), arsenic (As), or the like is used as an impurity (n-type impurity) to form an n type. FIG. 1 shows a maximal value Q_R1 of the n-type impurity concentration in the n-type region R1 and maximal values Q1 to Q5 of the p-type impurity concentration in the p-type region R3, which will be described later in detail.

The imaging apparatus 100 further includes a floating diffusion FD and a gate electrode GTX. The floating diffusion FD is an n-type region formed in the surface of the substrate SUB and in the vicinity thereof at a position spaced apart from the n-type region R1. The gate electrode GTX is the gate electrode of a MOS transistor (transfer transistor) that connects the n-type region R1 and the floating diffusion FD, and is formed on an insulating film F on the substrate SUB. Charges generated by photoelectric conversion and accumulated in the n-type region R1 are transferred to the floating diffusion FD via a channel formed by supplying an activation voltage to the gate electrode GTX. The transferred charges or a signal according to them is read out by a readout circuit (not shown) as a pixel signal.

The imaging apparatus 100 further includes an element isolation part STI having an STI (Shallow Trench Isolation) structure and formed near the surface of the substrate SUB, and a p-type impurity region CS formed around the element isolation part STI and serving as a channel stop. The element isolation part STI electrically isolates elements or units formed in the substrate SUB from each other.

A structure including conductive members (wiring patterns) arranged in one or more interconnection layers, plugs that connect them, and optical elements (for example, color filters and microlenses) can be arranged on the substrate SUB, although a description thereof will be omitted here.

Figure 11:
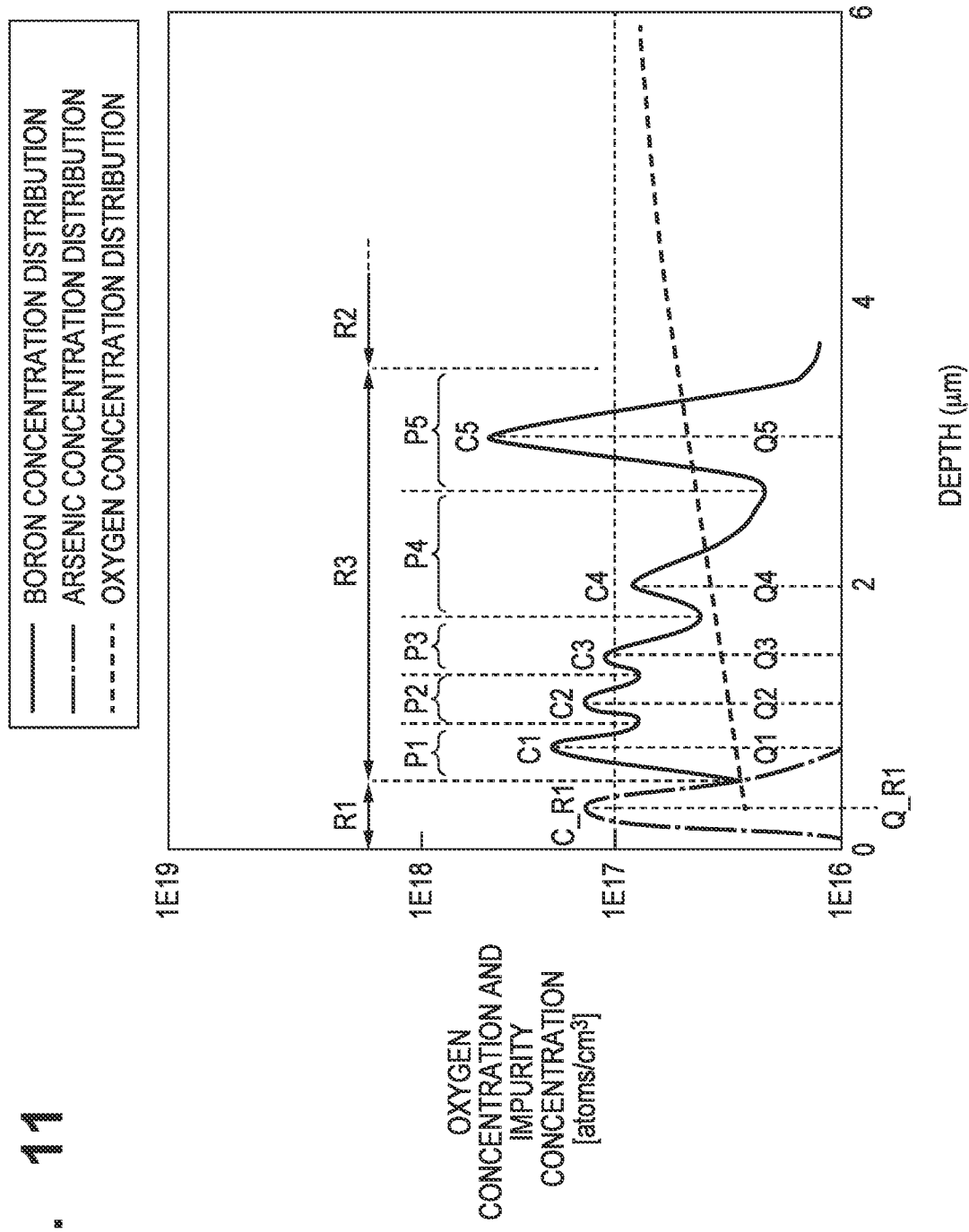
FIG. 11 is a graph for explaining an impurity concentration distribution and an oxygen concentration distribution in a substrate.

FIG. 11 shows the actual concentration distributions of the impurities (boron and arsenic) along a cut line A1-A2 (the depth direction from the surface of the substrate SUB) in FIG. 10. Note that only the impurity concentrations in portions necessary for the description of the embodiment are shown here, and impurity concentration distributions in remaining portions (for example, the region R0 and the like) are not shown.

An "actual" impurity concentration in a region means an impurity concentration that actually exists in the region irrespective of the conductivity type of the region, and is also called a "gross impurity concentration". On the other hand, a "net" impurity concentration in a region means an effective impurity concentration that decides the conductivity type of the region, and is also called a "net impurity concentration". That is, the net impurity concentration is equivalent to an impurity concentration obtained by subtracting, from the actual impurity concentration of one conductivity type, the actual impurity concentration of the other conductivity type that is different from the conductivity type. For example, when the actual boron (p-type impurity) concentration in a region is $4\times10^{16}$ [cm$^{-3}$], and the actual arsenic (n-type impurity) concentration is $1\times10^{16}$ [cm$^{-3}$], the conductivity type of the region is a p type, and the net concentration of the p-type impurity in the region is $3\times10^{16}$ [cm$^{-3}$].

FIG. 11 shows actual impurity concentrations. The p-type impurity concentration in the n-type region R1 is much lower than the n-type impurity concentration in the n-type region R1. In addition, the n-type impurity concentration in the n-type region R2 is much lower than the p-type impurity concentration in the n-type region R2. For this reason, net impurity concentrations corresponding to FIG. 11 are substantially the same as the impurity concentrations shown in FIG. 11.

Referring to FIG. 11, the n-type impurity (arsenic) concentration in the n-type region R1 is indicated by an alternate long and short dashed line, and the p-type impurity (boron) concentration in the p-type region R3 is indicated by a solid line (note that the oxygen concentration in the substrate SUB is indicated by a broken line, which will be described later in detail). A position at which the n-type impurity concentration in the n-type region R1 exhibits a maximal value C_R1 is defined as the peak position Q_R1. The above-described charges generated by photoelectric conversion can mainly be accumulated at the peak position Q_R1 in the n-type region R1 and in the vicinity thereof (for example, a portion where the concentration is $1\times10^{16}$ [cm$^{-3}$] or more and, more particularly, a portion where the concentration is $1\times10^{17}$ [cm$^{-3}$] or more). The peak position Q_R1 corresponds to a depth (a depth from the surface of the substrate SUB) of about 0.3 [μm], and the net concentration of the n-type impurity is about $1.23\times10^{17}$ [cm$^{-3}$]. For a portion other than the charge accumulation part in the n-type region R1, the net concentration of the n-type impurity can be less than $1\times10^{17}$ [cm$^{-3}$], or may be, for example, about $1\times10^{14}$ to $1\times10^{16}$ [cm$^{-3}$].

The p-type region R3 includes, for example, a plurality of portions P0 to P5 in the depth direction from the surface of the substrate SUB. In this example, the portion P0 is a portion that surrounds the region R1. The portions P1 to P5 include positions Q1 to Q5, respectively, at which the p-type impurity concentration exhibits maximal values C1 to C5, respectively. FIG. 11 shows the peak positions Q1, Q2, Q3, Q4, and Q5 at which the p-type impurity concentration exhibits the maximal values C1, C2, C3, C4, and C5 for the portions P1, P2, P3, P4, and P5, respectively (P1 to P5 and Q1 to Q5 are illustrated in FIG. 10 as well). The boundaries between the portions P0 to P5 are set at positions at which the impurity concentration in the distribution of the net concentration of the p-type impurity exhibits minimal values. This structure is obtained by, for example, performing impurity implantation a plurality of times using implantation energies different from each other. According to this method, the p-type region R3 can be formed up to a desired depth while adjusting the impurity concentration distribution to a desired concentration.

In the p-type region R3, the net concentration of the p-type impurity in the deepest portion P5 out of the portions P1 to P5 is made higher than the net concentrations of the p-type impurity in the portions P1 to P4 other than the portion P5. For example, the maximal value C5 of the net concentration of the p-type impurity for the portion P5 is preferably at least three times, and more preferably, at least five times larger than the maximal values C1 to C4 of the net concentration of the p-type impurity for the portions P1 to P4. According to this structure, it is possible to prevent charges generated in the p-type region R3 by photoelectric conversion from leaking (more specifically, charges from leaking to portions deeper than the p-type region R3) and efficiently guide the charges to the n-type region R1.

For example, the peak position Q1 in the portion P1 corresponds to a depth of about 0.7 [μm], and the maximal value C1 of the net concentration of the p-type impurity is about $2.0\times10^{17}$ [cm$^{-3}$]. The peak position Q2 in the portion P2 corresponds to a depth of about 1.2 [μm], and the maximal value C2 of the net concentration of the p-type impurity is about $1.7\times10^{17}$ [cm$^{-3}$]. The peak position Q3 in the portion P3 corresponds to a depth of about 1.6 [μm], and the maximal value C3 of the net concentration of the p-type impurity is about $1.0\times10^{17}$ [cm$^{-3}$]. The peak position Q4 in the portion P4 corresponds to a depth of about 2.0 [μm], and the maximal value C4 of the net concentration of the p-type impurity is about $0.9\times10^{1\prime}$ [cm$^{-3}$]. The peak position Q5 in the portion P5 corresponds to a depth of about 3.2 [μm], and the maximal value C5 of the net concentration of the p-type impurity is about $4.0\times10^{17}$ [cm$^{-3}$]. As for the maximal values C1 to C4 of the net concentration of the p-type impurity in the portions P1 to P4, the deeper the position is, the smaller the maximal value is (C1>C2 >C3>C4). Note that the depths are determined based on the entrance depth of incident light (for example, red light) from the surface of the substrate SUB.

(1-2. White Spot Defect that can be Generated in Image)

During the manufacture of the imaging apparatus 100, a metal impurity (for example, nickel or cobalt) may be mixed into the substrate SUB by, for example, silicidation processing. The metal impurity can lead to a white spot defect in an image. Focusing on this point, the present inventor conducted experiments and made extensive studies using a plurality of substrates SUB having structures different from each other. By experiments using a plurality of substrates SUB in which the distributions of the net concentration of the p-type impurity in the p-type region R3 were different from each other, the present inventor found that the degree of white spot defects depends on the width (volume) of the depletion layer between the n-type region R1 and the p-type region R3. More specifically, the present inventor found that the number of white spot defects in an image tends to increase when the number of metal impurities in the depletion layer between the n-type region R1 and the p-type region R3 increases. This is probably because the metal impurities in the depletion layer have some effect on accumulated charges in the n-type region R1 by a depletion layer electric field or via the electric field.

Hence, in this structure, the width of the depletion layer between the n-type region R1 and the p-type region R3 is reduced, thereby suppressing white spot defects. More specifically, the maximal values C1 and C2 of the net concentration of the p-type impurity in the portions P1 and P2 of the p-type region R3 on the side of the n-type region R1 are made larger than the maximal values C3 and C4 of the net concentration of the p-type impurity in the portions P3 and P4 of the p-type region R3 on the side of the n-type region R2. This can prevent the depletion layer from reaching a deep position in the p-type region R3. In addition, the net concentration of the p-type impurity in the portions of the p-type region R3 on the side of the n-type region R1 is made higher than the net concentration of the n-type impurity in the charge accumulation part of the n-type region R1. More specifically, as shown in FIG. 11, the net concentration of the p-type impurity at the peak position Q1 in the portion P1 of the p-type region R3 is made higher than the net concentration of the n-type impurity at the peak position Q_R1 in the n-type region R1. According to this structure, for example, during the charge accumulation mode (an operation mode to accumulate charges in the n-type region R1) of the imaging apparatus 100, the depletion layer between the n-type region R1 and the p-type region R3 can be prevented from reaching the portions P2 to P5 deeper than the portion P1.

In summary, the p-type region R3 is formed such that the width of the depletion layer between the n-type region R1 and the p-type region R3 becomes small. In this example, the p-type region R3 is formed such that the net concentration of the p-type impurity in one part becomes higher than the net concentration of the p-type impurity in another part at a position deeper than the one part, thereby preventing the depletion layer from reaching the other part. In addition, the net concentration of the p-type impurity in the one part of the p-type region R3 is made higher than the net concentration of the n-type impurity at the peak position Q_R1 in the n-type region R1. Preferably, the net concentration of the p-type impurity in the portion P1 closest to the n-type region R1 out of the portions P1 to P5 of the p-type region R3 is made higher than the net concentration of the n-type impurity at the peak position Q_R1 in the n-type region R1.

Also in this example, the maximal values C2 to C4 of the net concentration of the p-type impurity in the portions P2 to P4 between the portion P1 and the portion P5 are preferably smaller than the maximal value C1 of the net concentration of the p-type impurity in the portion P1. In addition, the maximal values C2 to C4 of the net concentration of the p-type impurity in the portions P2 to P4 are preferably smaller than the maximal value C5 of the net concentration of the p-type impurity in the portion P5. Furthermore, the net concentration of the p-type impurity in one of the portions P2 to P4 is preferably lower than the net concentration of the n-type impurity in the n-type region R1. In this example, the maximal value C3 and C4 of the net concentration of the p-type impurity in the portions P3 and P4 are smaller than the maximal value C_R1 of the net concentration of the n-type impurity at the peak position Q_R1 in the n-type region R1.

(1-3. Afterimage that can be Generated in Image)

When the oxygen concentration in the substrate SUB rises, a complex of oxygen (thermal donor) is readily formed in the substrate SUB. The thermal donor may trap, by its energy level, charges generated by photoelectric conversion, and this may leads to an afterimage in an image. For example, charges generated by photoelectric conversion when reading out a first image can be trapped by the energy level of the thermal donor. After that, if the trapped charges are released when reading out a second image different from the first image, an afterimage derived from the charges can be generated in the second image.

According to Japanese Patent Laid-Open No. 2007-251074, an afterimage in an image is suppressed by lowering the oxygen concentration in a substrate. On the other hand, according to Japanese Patent Laid-Open No. 2003-92301, white spot defects in an image are suppressed by raising the oxygen concentration in a substrate.

As described with reference to FIG. 11, when the p-type region R3 is formed such that the width of the depletion layer between the n-type region R1 and the p-type region R3 becomes small, white spot defects can be suppressed. Concerning the range in which the oxygen concentration in the substrate SUB should be set to sufficient suppress an afterimage in this structure, the present inventor conducted experiments and made extensive studies using a plurality of substrates SUB having oxygen concentrations (about $0.7\times10^{17}$ to $14\times10^{17}$ [atoms/cm$^3$]) different from each other.

Referring back to FIG. 11, FIG. 11 also shows the oxygen concentration distribution in the substrate SUB along the cut line A1-A2 in FIG. 10. As shown in FIG. 11, in this structure, the oxygen concentration in the substrate SUB is set to $1\times10^{17}$ [atoms/cm$^3$] or less, thereby suppressing the afterimage.

Charges generated by photoelectric conversion reach the depletion layer between the n-type region R1 and the p-type region R3 and then drift toward the n-type region R1 via a large depletion layer electric field. In a portion that is not particularly depleted out of the p-type region R3, the electric field is smaller than the depletion layer electric field, and therefore, the charges are readily trapped by the energy level of the thermal donor (this causes an afterimage in an image, as described above). Hence, formation of a thermal donor in the undepleted portion is prevented. The oxygen concentration in at least the undepleted portion is set to $1\times10^{17}$ [atoms/cm$^3$] or less. That is, the oxygen concentration from a position in the p-type region R3 at which the net concentration of the p-type impurity is higher than the net concentration of the n-type impurity at the peak position Q_R1 in the n-type region R1 or a portion including it (the portion P1 in this example) to a deeper portion is set to $1\times10^{17}$ [atoms/cm$^3$] or less. Preferably, the oxygen concentration in the substrate SUB is set to $1\times10^{17}$ [atoms/cm$^3$] or less in a region including the entire p-type region R3 (a region from the n-type region R1 or a shallower position to the p-type region R3 or a deeper position). In the n-type region R2 at a position deeper than the p-type region R3, the oxygen concentration can be higher than the oxygen concentration in the p-type region R3, and may be, for example, $1\times10^{17}$ [atoms/cm$^3$] or more.

For example, in a region from the surface of the substrate SUB to a depth of 15 [μm] (this region has a sufficient depth to include the p-type region R3), the oxygen concentration in the substrate SUB is set to $1\times10^{17}$ [atoms/cm$^3$] or less. In another example, in a region from the surface of the substrate SUB to a depth of 10 [μm], the oxygen concentration in the substrate SUB may be set to $1\times10^{17}$ [atoms/cm$^3$] or less. In a region from a depth of 10 [μm] from the surface to a depth of 20 [μm] from the surface, the oxygen concentration in the substrate SUB may be set to $2\times10^{17}$ [atoms/cm$^3$] or less. In a still another example, in part of a region from a depth of 10 [μm] from the substrate surface to a depth of 20 [μm] from the surface, the oxygen concentration in the substrate SUB may be higher than $1\times10^{17}$ [atoms/cm$^3$].

Note that the oxygen concentration in the portions P1 to P5 of the p-type region R3 may be $1\times10^{16}$ [atoms/cm$^3$] or more, as shown in FIG. 11. The existence of the oxygen concentration of $1\times10^{16}$ [atoms/cm$^3$] or more is effective for improvement of the substrate strength, gettering of an impurity metal, and the like. In this example, the oxygen concentration in the region between the peak positions C4 and C5 is made higher than the net concentration of the p-type impurity in the region.

FIG. 12A is a plot showing an actual measurement result of the oxygen concentration dependence in the substrate SUB for an afterimage in an image. The abscissa in FIG. 12A represents the oxygen concentration [atoms/cm$^3$] in the substrate SUB, and the ordinate represents the degree of an afterimage (afterimage amount) [LSB] in an image. According to FIG. 12A, when the oxygen concentration in the substrate SUB is lowered, the afterimage amount becomes small. In the range in which the oxygen concentration in the substrate SUB is $1\times10^{17}$ [atoms/cm$^3$] or less, the afterimage amount is 8 [LSB] or less, and an afterimage in an image can sufficiently and effectively be reduced.

FIG. 12B shows the results of determining whether the afterimage amount and the degree of white spot defects fall within permissible ranges of cases in which the oxygen concentration in the substrate SUB is high and low and cases in which the net concentration of the p-type impurity in the p-type region R3 is high and low. In FIG. 12B, "high" for the oxygen concentration in the substrate SUB indicates that the oxygen concentration is higher than $1\times10^{17}$ [atoms/cm$^3$], and "low" indicates that the oxygen concentration is $1\times10^{17}$ [atoms/cm$^3$] or less. "Low" for the net concentration of the p-type impurity in the p-type region R3 indicates that the concentration of the p-type impurity in at least part of the p-type region R3 is lower than the net concentration of the n-type impurity in the n-type region R1, and other cases are represented by "high".

For each of the above-described cases, the results of afterimage/white spot defects within the permissible ranges are indicated by "O", and other results are indicated by "x". For example, in FIG. 12B, if the afterimage amount falls within the permissible range, and the degree of white spot defects falls outside the permissible range, the result is indicated by "O/X". As is apparent from FIG. 12B, when the oxygen concentration in the substrate SUB is "low", and the net concentration of the p-type impurity in the n-type region R2 is "high", both the afterimage amount and the degree of white spot defects fall within the permissible ranges.

(1-4. Summary)

According to this structure, the p-type region R3 is formed such that the net concentration of the p-type impurity in one part becomes higher than the net concentration of the p-type impurity in another part at a position deeper than the one part, thereby preventing the depletion layer from reaching the other part. This can decrease the width of the depletion layer between the n-type region R1 and the p-type region R3 and suppress white spot defects in an image. In addition, the oxygen concentration in the substrate SUB is set to $1\times10^{17}$ [atoms/cm$^3$] or less, thereby preventing a thermal donor from being formed in a deep portion of the p-type region R3. This can suppress an afterimage in an image.

As described above, this embodiment is advantageous in suppressing both an afterimage and white spot defects in an image.

In particular, if the imaging apparatus 100 includes a digital circuit, the method of manufacturing the imaging apparatus 100 can include, for example, a step of siliciding the electrodes of transistors and the like in the digital circuit. Hence, a metal impurity may be mixed into the substrate SUB. For example, the imaging apparatus 100 includes a pixel unit in which a plurality of pixels are arrayed, and a peripheral circuit unit arranged on the periphery of the pixel unit and configured to process a signal from each pixel. A transistor including silicide regions in the source and drain can be used as a transistor in the peripheral circuit unit. The peripheral circuit unit includes, for example, an analog/digital conversion circuit. The transistor including the silicide regions can also be used in part of the analog/digital conversion circuit. As the metal of the silicide region, nickel, cobalt, or the like is typically used. Part of the metal can diffuse into the pixel unit as an impurity in a step of siliciding a transistor (a step of forming a silicide region) and a subsequent annealing step. As described above, this may cause white spot defects in an image. Hence, this embodiment is advantageous in suppressing both an afterimage and white spot defects in an image particularly in the imaging apparatus 100 including a silicided region.

FIGS. 13A to 13E are schematic views for explaining steps of a method of manufacturing the imaging apparatus 100.

Figure 13A:
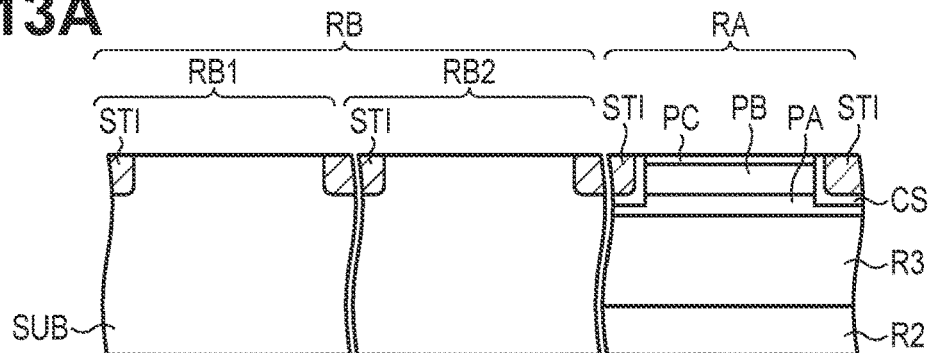
FIGS. 13A to 13E are sectional views for explaining an example of a method of manufacturing an imaging apparatus.

In the step of FIG. 13A, the substrate SUB having an oxygen concentration of $2\times10^{17}$ [atoms/cm$^3$] or less and including an area RA (pixel area) where a pixel unit should be formed and an area RB (peripheral area) where a peripheral circuit unit should be formed is prepared. The peripheral area RB includes, for example, an area RB1 where an NMOS transistor should be formed and an area RB2 where a PMOS transistor should be formed.

For example, a single crystal silicon layer having an oxygen concentration of $1\times10^{16}$ [atoms/cm$^3$] or less is formed by epitaxial growth on a silicon wafer having an oxygen concentration of $1\times10^{16}$ [atoms/cm$^3$] (inclusive) to $3\times10^{17}$ [atoms/cm$^3$](inclusive). A silicon wafer whose oxygen concentration does not exceed $3\times10^{17}$ [atoms/cm$^3$] is preferably used. This is because if a silicon wafer having a high oxygen concentration (for example, $1\times10^{18}$ [atoms/cm$^3$] or more) is used, and a single crystal silicon layer having a low oxygen concentration is formed on it, the oxygen moves (diffuses) from the wafer to the single crystal silicon layer in another subsequent step (an annealing step or the like). Hence, a silicon wafer having an oxygen concentration of at least $5\times10^{17}$ [atoms/cm$^3$] or less is used.

Note that the single crystal silicon layer formed by epitaxial growth is formed such that its thickness falls within the range of 5 to 25 [µm]. Accordingly, even when a silicon wafer with a relatively high oxygen concentration is used, the oxygen in the silicon wafer can diffuse to the vicinity of the surface of the single crystal silicon layer, and the oxygen concentration in the single crystal silicon layer can be prevented from rising.

In the prepared substrate SUB, the element isolation parts STI having, for example, an STI structure can be formed between the areas RA, RB1, and RB2. The element isolation part STI can be made of an insulating member such as silicon oxide. The depth of the element isolation part STI is about 0.1 to 0.5 [µm].

After that, a p-type impurity is implanted into the pixel area RA, thereby forming the p-type region R3. The p-type region R3 includes the above-described portions P0 to P5 (the portions P0 to P5 are not illustrated here). The portions P0 to P5 can be formed by, for example, performing impurity implantation a plurality of times using implantation energies different from each other.

In the vicinity of the surface of the substrate SUB, for example, p- or n-type portions PA, PB, and PC may be formed to adjust the threshold voltage of a transistor to be formed later. Additionally, in a portion in contact with the element isolation part STI out of the substrate SUB, the p-type region CS may be formed so as to surround the element isolation part STI to reduce a dark current component that can be mixed into a pixel signal due to a crystal defect at the boundary between the substrate SUB and the element isolation part STI.

Figure 13B:
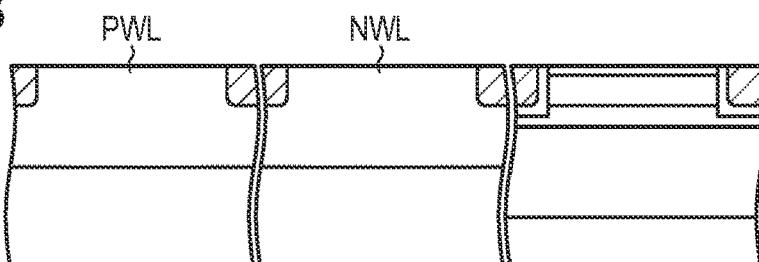

In the step of FIG. 13B, a p-type well PWL is formed in the area RB1 by impurity implantation using, for example, a predetermined resist pattern (not shown) formed on the substrate SUB. After that, an n-type well NWL is formed in the area RB2 according to the same procedure as described above. Either well can be formed first.

Figure 13C:
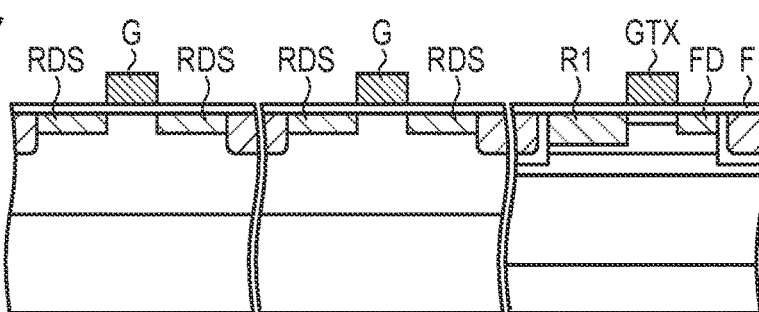

In the step of FIG. 13C, the insulating film F (the gate insulating film of a transistor) is formed on the surface of the substrate SUB. The insulating film F is made of, for example, silicon oxide and has a film thickness of 3 to 20 [nm]. After that, the gate electrode GTX of a transfer transistor and gate electrodes G of other MOS transistors are formed on the insulating film F. In addition, an n-type impurity is implanted into the surface of the substrate SUB and the vicinity thereof, thereby forming the n-type region R1. The n-type region R1 is formed such that the above-described peak position Q_R1 is located deeper than ½ the depth of the element isolation part STI, and preferably, deeper than the bottom surface of the element isolation part STI.

After that, the floating diffusion FD can be formed using the gate electrode GTX as a mask. In each of the areas RB1 and RB2, source/drain regions RDS of a corresponding MOS transistor can be formed.

Note that the formation order of the elements of the pixel may be changed as needed. For example, either of the gate electrode GTX and the n-type region R1 can be formed first.

Figure 13D:
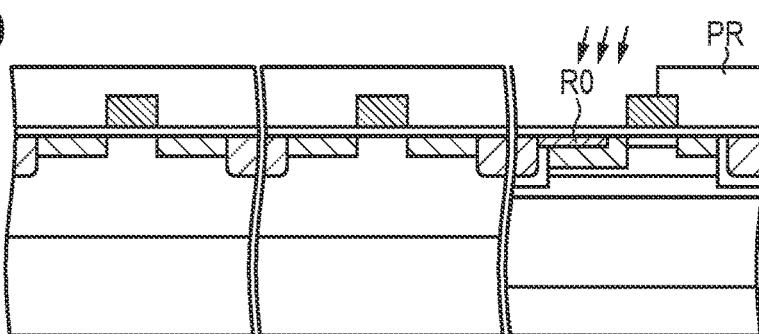

In the step of FIG. 13D, the region R0 to bury the n-type region R1 is formed. The region R0 can be formed at a position spaced apart from an end of the gate electrode GTX to maintain the charge transfer efficiency of the transfer transistor. The region R0 is formed by, for example, implanting a p-type impurity into the substrate SUB (more specifically, part of the n-type region R1) using the gate electrode GTX and a resist pattern PR as a mask. The implantation angle of the impurity (the angle made by the normal to the upper surface of the substrate SUB and the impurity implantation direction) is set within the range of, for example, 70 to 450. The region R0 is thus formed at a position spaced apart from an end of the gate electrode GTX. For example, if the height of the gate electrode GTX is 250 [nm], the implantation is performed with an implantation energy of 12 [keV] at an implantation angle of 10° to 20°.

Figure 13E:
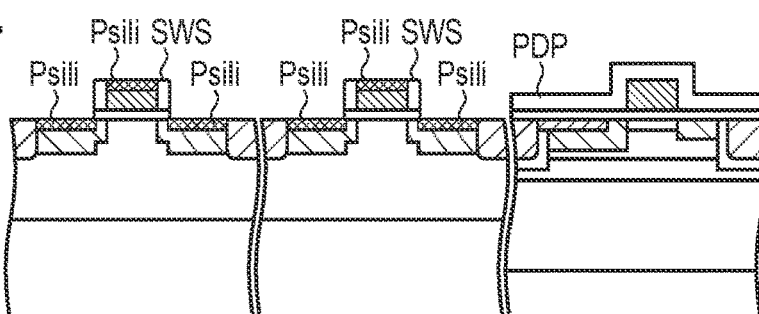

In the step of FIG. 13E, an insulating film that covers the areas RA, RB1, and RB2 is formed. The insulating film is partially etched to form side wall spacers SWS on the side walls of the gate electrodes G. At this time, another part of the insulating film can be left in the area RA as a protective film PDP. An n-type impurity is implanted, thereby making the NMOS transistor in the area RB1 have an LDD structure. Similarly, a p-type impurity is implanted, thereby making the PMOS transistor in the area RB2 have an LDD structure. After that, silicidation processing is performed for the MOS transistors using a salicide process. At this time, the protective film PDP in the area RA can be used as a silicide protection. Portions Psili indicate silicide regions out of the electrodes of the MOS transistors.

After that, using a known semiconductor manufacturing technique, a structure including a wiring pattern, an optical element, and the like is formed on the structure obtained in the step of FIG. 13E. The imaging apparatus 100 can thus be manufactured.

The imaging apparatus 100 can include element isolation parts P1 and P2 each having an STI structure, as described with reference to FIG. 13A. The element isolation parts P1 and P2 can be formed by, for example, forming trenches from the surface of the substrate SUB to a predetermined depth by etching or the like and filling the trenches with insulating members. According to this step, a metal impurity may be mixed into the substrate SUB. In addition, white spot defects may be generated in an image due to stress applied to the substrate SUB in association with annealing in the meantime, stress applied to the substrate SUB by the formed element isolation parts P1 and P2, and the like. For this reason, applying the present invention to the imaging apparatus 100 including the element isolation parts with the STI structure is also advantageous in suppressing both an after-image and white spot defects in an image.

FIGS. 14A to 14D are views for explaining the step of forming the element isolation part (to be referred to as an element isolation part P) with the STI structure in the method of forming the imaging apparatus 100. In the step of FIG. 14A, a structure in which a silicon oxide film F1, a polysilicon film F2, and a silicon nitride film F3 are formed in this order on the substrate SUB made of, for example, silicon is prepared.

In the step of FIG. 14B, trenches T are formed by, for example, etching or the like using a predetermined resist pattern (not shown). The trenches T are formed from the upper surface of the silicon nitride film F3 to the surface the substrate SUB and then to a predetermined depth.

In the step of FIG. 14C, for example, oxidation processing is performed to form an oxide film F4 (silicon oxide film) on each surface of the substrate SUB exposed by the trenches T. The oxidation processing is performed by, for example, dry oxidation at a temperature of about 1,100° C. The film thickness of the oxide film F4 is set to about 20 to 50 [nm].

Note that in this step, the exposed surfaces of the substrate SUB are oxidized, and simultaneously, the surfaces (side surfaces) of the polysilicon film F2 exposed by the trenches T are also oxidized. With this processing, a silicon oxide film is formed on each exposed surface of the polysilicon film F2 as well. The silicon oxide film has a function of maintaining the shape of the trench T.

In the step of FIG. 14D, the trenches T are filled with an insulating member IM such as silicon oxide. This step is done by a deposition method such as CVD (Chemical Vapor Deposition). After that, the upper surface of the insulating member IM is planarized by, for example, CMP processing, thus forming the element isolation parts P.

Note that some preferred embodiments have been described above. However, the present invention is not limited to those embodiments and may partially be changed without departing from the scope of the present invention. For example, the conductivity types of the semiconductor regions may be reversed. As the impurity to form each semiconductor region, a different element of the same conductivity type may be used.

Individual terms described in this specification are merely used for the purpose of explaining the present invention. The present invention is not limited to the strict meanings of the terms, as a matter of course, and can also include their equivalents. For example, an "imaging apparatus" can include a solid-state imaging apparatus such as a CCD image sensor or a CMOS image sensor. A "pixel" may be called a sensor, and accordingly, a "pixel signal" may be called a sensor signal.

Figure 15:
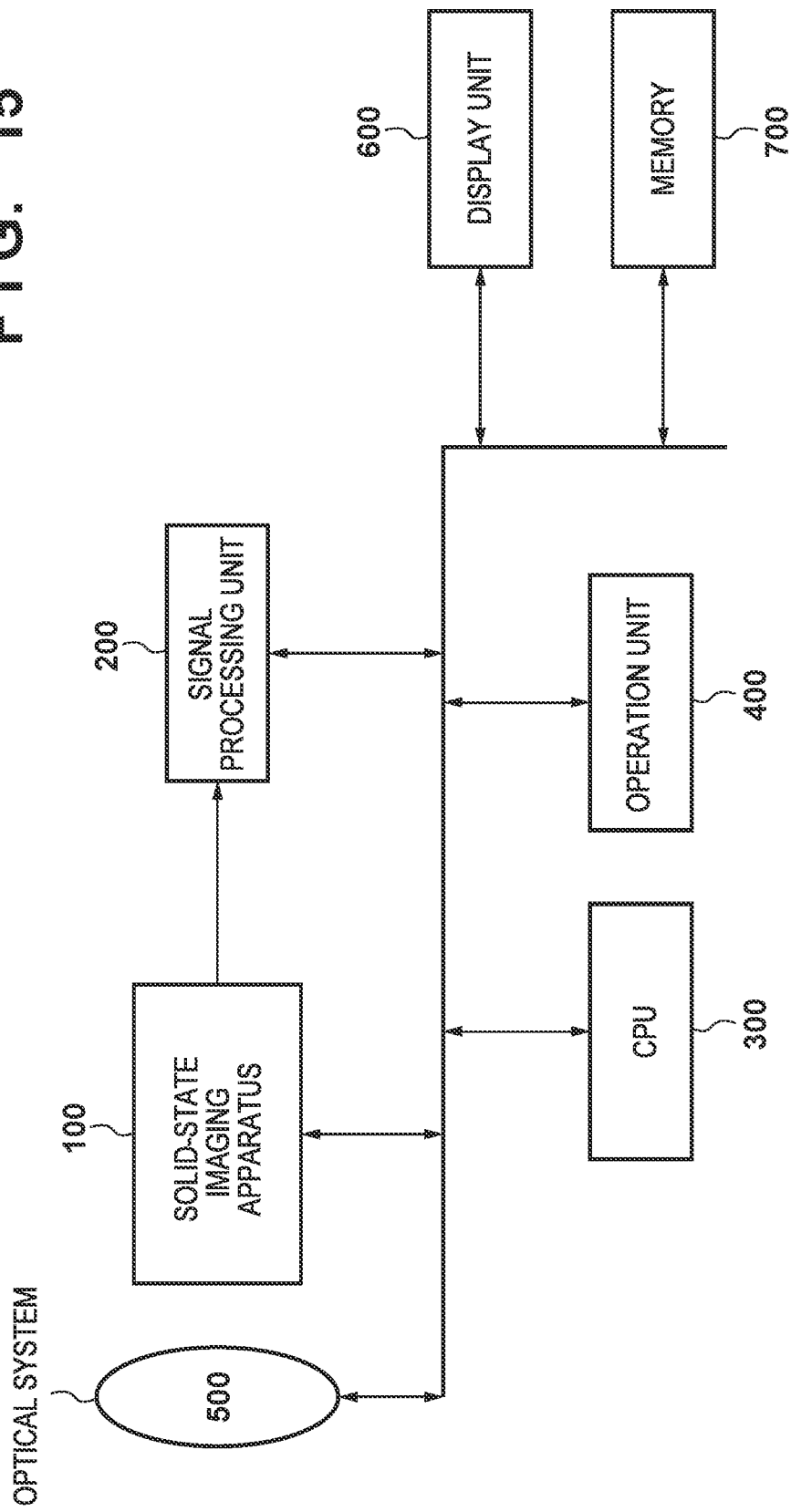
FIG. 15 is a block diagram for explaining an example of the arrangement of a camera.

FIG. 15 is a block diagram for explaining an example of the arrangement of a camera to which the imaging apparatus 100 described in the above embodiment is applied. The camera includes, for example, a processing unit 200, a CPU 300 (or a processor), an operation unit 400, and an optical system 500 in addition to the imaging apparatus 100. The camera can further include a display unit 600 configured to display a still image or a moving image to the user, and a memory 700 configured to store the data. The imaging apparatus 100 generates image data formed from a digital signal based on light that has passed through the optical system 500. The image data undergoes predetermined image processing by the processing unit 200 and is output to the display unit 600 or the memory 700. In addition, the CPU 300 can change the setting information of each unit or the control method of each unit based on an imaging condition input by the user via the operation unit 400. The concept of the camera includes not only apparatuses mainly aiming at shooting but also apparatuses (for example, a personal computer or a portable terminal) having an auxiliary shooting function.

Still another aspect of the present invention will be described below by way of the third embodiment as an exemplary embodiment.

This embodiment is an embodiment including both the features of the first embodiment and those of the second embodiment. That is, in this embodiment, the photoelectric conversion element PD according to the first embodiment has the same structure as that of the photodiode according to the second embodiment in which a p-n junction is formed between the n-type region R1 and the p-type region R3. In this embodiment, the first semiconductor region 101 according to the first embodiment corresponds to the n-type region R4 according to the second embodiment. The impurity region 102a according to the first embodiment corresponds to the n-type region R2 according to the second embodiment. The impurity region 103 having the second conductivity type according to the first embodiment corresponds to the p-type region R3 according to the second embodiment. Since the p-type region R3 includes the plurality of portions P0 to P5, as described in the second embodiment, the impurity region 103 includes a plurality of portions corresponding to the plurality of portions P0 to P5. The impurity region 104 of the first conductivity type according to the first embodiment corresponds to the n-type region R1 according to the second embodiment. The impurity region 102b of the first conductivity type according to the first embodiment corresponds to the portion PA or PB according to the second embodiment. In this embodiment, the semiconductor substrate SS according to the first embodiment and the substrate SUB according to the second embodiment will integrally be described as a "substrate S".

FIG. 11 shows only the oxygen concentration up to a depth of 6 μm in the substrate SUB. In this embodiment, the substrate has the same oxygen concentration distribution as in FIG. 9 even in a portion ranging from 6 m (exclusive) to 20 μm (exclusive) deep where the n-type region R4 exists. That is, letting Cmax and Cmin respectively be the maximum value and the minimum value of the oxygen concentration in the semiconductor region of a portion at a distance of 20 μm or less from the surface of the substrate S, Cmax/Cmin is 10 or less, and preferably, 5 or less. The oxygen concentration in the semiconductor region of the portion at the distance of 20 μm or less from the surface falls within the range of $2\times10^{16}$ atoms/cm$^3$ (inclusive) to $4\times10^{17}$ atoms/cm$^3$ (inclusive). The remaining points are the same as in the first and second embodiments.

In this embodiment, in the shallow portion of the substrate S (the semiconductor substrate SS or the substrate SUB), the existence of oxygen at $1\times10^{16}$ [atoms/cm$^3$] or more is effective for gettering of an impurity metal and the like. In this embodiment, however, the oxygen concentration in the deep portion (the first semiconductor region 101 or the n-type region R4) of the semiconductor substrate SS or substrate SUB is as low as $5\times10^{15}$ [atoms/cm$^3$]. Hence, the impurity metal gettering effect in the deep portion of the substrate S cannot be expected to be large. The metal in the silicide region provided in a transistor of the peripheral circuit unit diffuses up to the pixel unit via the deep portion of the substrate S, as is known. The influence of the impurity metal existing in the deep portion is reduced by forming the p-type region of the photodiode such that the net concentration of the p-type impurity in one part becomes higher than the net concentration of the p-type impurity in another part at a position deeper than the one part. It is therefore possible to suppress both an afterimage and white spot defects to appropriate levels.

Yet another aspect of the present invention will be described below by way of the fourth embodiment as an exemplary embodiment.

This embodiment has a feature in the element isolation part described in the first to third embodiments. The element isolation part 110 according to the first embodiment corresponds to the element isolation part STI in the pixel area RA according to the second embodiment. The insulator 160 and the silicon oxide film 170 of the element isolation part 110 according to the first embodiment correspond to the insulating member IM and the oxide film F4 of the element isolation part STI according to the second embodiment, respectively. The impurity region 109 according to the first embodiment corresponds to the impurity region CS according to the second embodiment. The element isolation part 110 according to the first embodiment and the element isolation part STI in the pixel area RA according to the second embodiment will integrally be described below as an "element isolation part ISO". In addition, the insulator 160 and the silicon oxide film 170 of the element isolation part 110 and the insulating member IM and the oxide film F4 of the element isolation part STI will integrally be described as an "insulator INS". The element isolation part ISO has an STI structure, and the typical insulator INS is made of silicon oxide. Note that concerning the peripheral area RB according to the second embodiment, an element isolation part STI and an insulating member IM will be described according to the second embodiment. In this embodiment as well, the semiconductor substrate SS according to the first embodiment and the substrate SUB according to the second embodiment will integrally be described as a "substrate S".

In this embodiment, a hydrogen concentration CA [atoms/cm$^3$] in the insulator INS of the element isolation part ISO is set to $5\times10^{18}$ [atoms/cm$^3$] or more. The hydrogen concentration CA in the insulator INS is preferably set to $1\times10^{19}$ [atoms/cm$^3$] or more, and more preferably, set to $3\times10^{19}$ [atoms/cm$^3$] or more. As described above, the existence of oxygen at $1\times10^{16}$ [atoms/cm$^3$] or more in the substrate S is effective for gettering of an impurity metal and the like. In this case, however, the impurity metal gettering effect weakens as compared to a case in which oxygen at, for example, $1\times10^{18}$ [atoms/cm$^3$] or more exists in the substrate S. When the hydrogen concentration CA is set to $5\times10^{18}$ [atoms/cm$^3$] or more or $1\times10^{19}$ [atoms/cm$^3$] or more, noise such as white spot defects caused by an impurity metal can be relaxed. This is probably because the impurity metal is deactivated by the hydrogen. In addition, to form the element isolation part ISO having the STI structure, trench etching of the substrate S is necessary. Degradation in image quality caused by damage in the substrate S upon trench etching can be reduced by terminating a dangling bond on the surface of the substrate S by the hydrogen. Note that the hydrogen concentration in the element isolation part having an STI structure in an imaging apparatus compared in this examination is $2\times10^{18}$ [atoms/cm$^3$] in the entire insulator of the element isolation part. Note that the hydrogen concentration CA in the insulator INS may be $3\times10^{21}$ [atoms/cm$^3$] or less or $1\times10^{21}$ [atoms/cm$^3$] or less. It is only necessary that a portion in which the hydrogen concentration CA meets the above-described condition exists in the insulator INS. A portion that does not meet the above-described condition may exist in the insulator INS. The hydrogen concentration CA in the entire insulator INS preferably meets the above-described condition. Note that the hydrogen concentration CA can be adjusted by employing a deposition method (for example, HDP-CVD) capable of increasing the hydrogen content in the insulator INS or a source gas (for example, silane-based gas) for deposition. The hydrogen concentration CA can also be adjusted by introducing hydrogen from an external element such as an insulating film containing hydrogen on the substrate S.

Figure 16A:
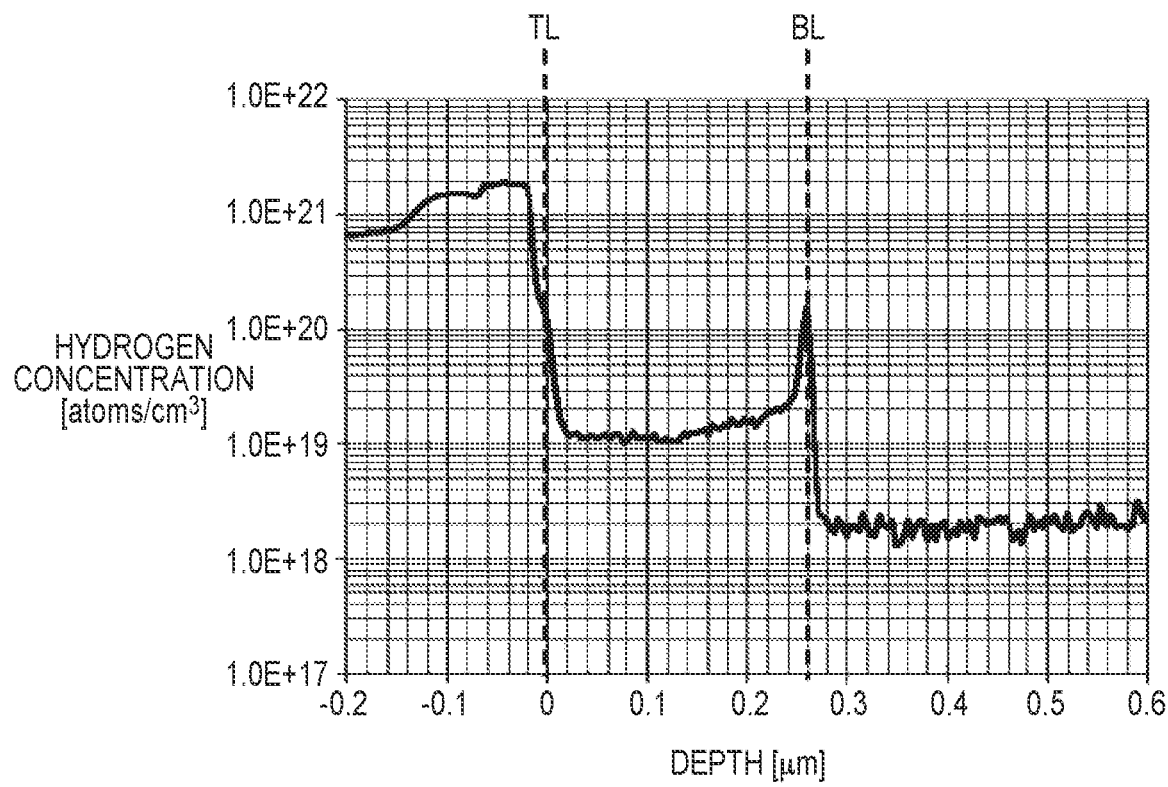
FIGS. 16A and 16B are graphs for explaining an element isolation part.
Figure 16B:
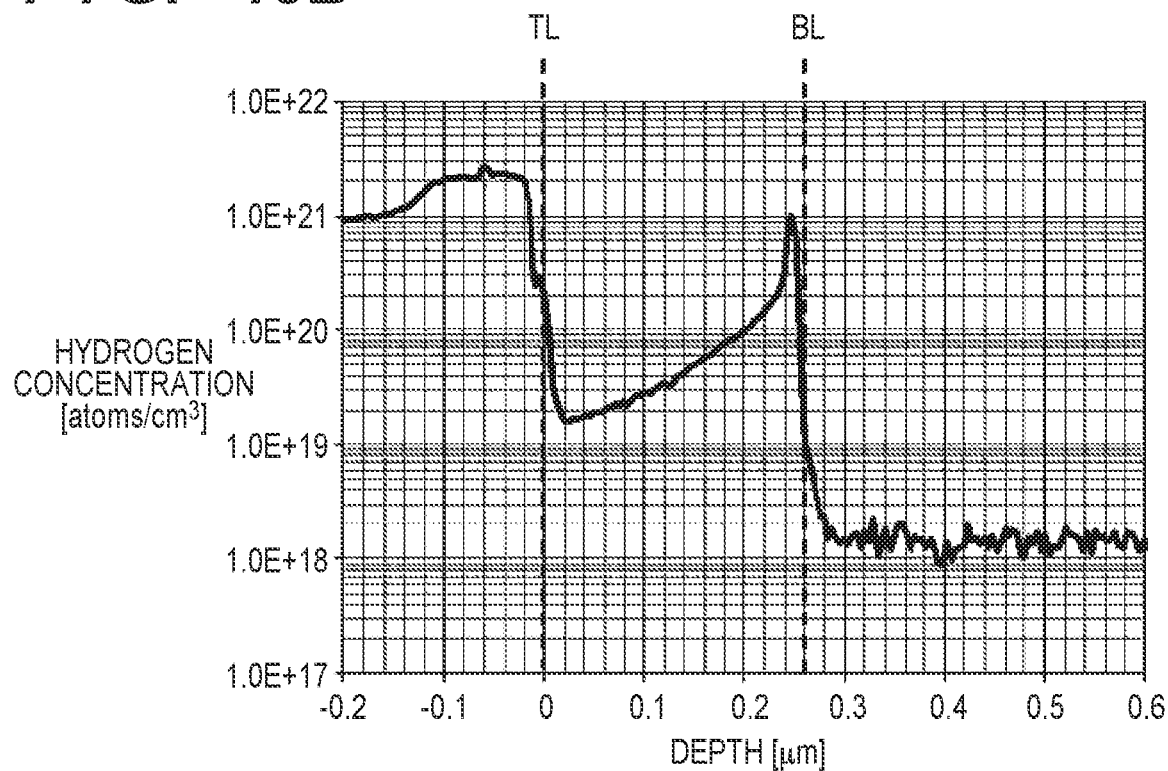

FIGS. 16A and 16B respectively show a first example and a second example of the distribution of the hydrogen concentration CA according to this embodiment. In FIGS. 16A and 16B, a position TL indicates the position of the surface of the substrate S, and a position BL indicates the position of the bottom surface of the element isolation part ISO. The difference between the position TL and the position BL corresponds to the depth of the element isolation part ISO. The depth of the element isolation part ISO is, for example, 0.1 to 0.5 μm and, typically, 0.2 to 0.4 μm. In the examples shown in FIGS. 16A and 16B, the depth of the element isolation part ISO is 0.26 μm. In the first example shown in FIG. 16A, the hydrogen concentration CA is distributed within the range of $1 \times 10^{19}$ to $2 \times 10^{20}$ [atoms/cm$^3$]. In the second example shown in FIG. 16B, the hydrogen concentration CA is distributed within the range of $2 \times 10^{19}$ to $1 \times 10^{21}$ [atoms/cm$^3$]. In both the first and second examples, the hydrogen concentration conspicuously rises in the vicinity of the bottom surface of the element isolation part ISO (in the vicinity of the position BL). As described above, based on the position corresponding to ½ the depth of the element isolation part ISO, the hydrogen concentration in the lower half on the side of the position BL is preferably higher than that in the upper half on the side of the position TL. This makes it possible to effectively supply hydrogen into the substrate S.

As described above, the hydrogen concentration CA [atoms/cm$^3$] in the insulator INS of the element isolation part ISO indicates a distribution. An index that quantitatively represents the hydrogen amount in the insulator INS is a hydrogen density DA [atoms/cm$^2$] in the insulator INS. The hydrogen density DA is an integrated value of the hydrogen concentration CA in the depth direction. If the hydrogen concentration CA is constant in the depth direction, and the depth of the element isolation part ISO is DP [cm], the hydrogen density DA is the product (DA=CA×DP) of the hydrogen concentration CA and the depth DP. If the hydrogen concentration CA represents a distribution, the hydrogen density DA is the total sum (DA=Σ(DR×CAn)) of the products of a resolution DR [cm] (DR=DP/n) in the depth direction and hydrogen concentrations CAn at the respective depths.

When the hydrogen density DA is set to $1 \times 10^{14}$ [atoms/cm$^2$] or more, a practical white spot defect reducing effect can be obtained. The hydrogen density DA of $1 \times 10^{14}$ [atoms/cm$^2$] corresponds to a case in which the hydrogen concentration CA is evenly $5 \times 10^{18}$ [atoms/cm$^3$] in the element isolation part ISO having a depth of 0.2 μm. The hydrogen density DA may be $3 \times 10^{15}$ [atoms/cm$^2$] or less. Note that the hydrogen density DA of $1 \times 10^{14}$ [atoms/cm$^2$] corresponds to a case in which the hydrogen concentration CA is evenly $1 \times 10^{20}$ [atoms/cm$^3$] in the element isolation part ISO having a depth of 0.3 μm. As described above, since the hydrogen concentration CA can be higher in the lower half of the element isolation part ISO than in the upper half, the hydrogen concentration CA in the lower half of the element isolation part ISO is dominant in the hydrogen density DA. Hence, the portion located in the lower half of the element isolation part ISO preferably meets the above-described condition of the hydrogen concentration CA.

Figure 17:
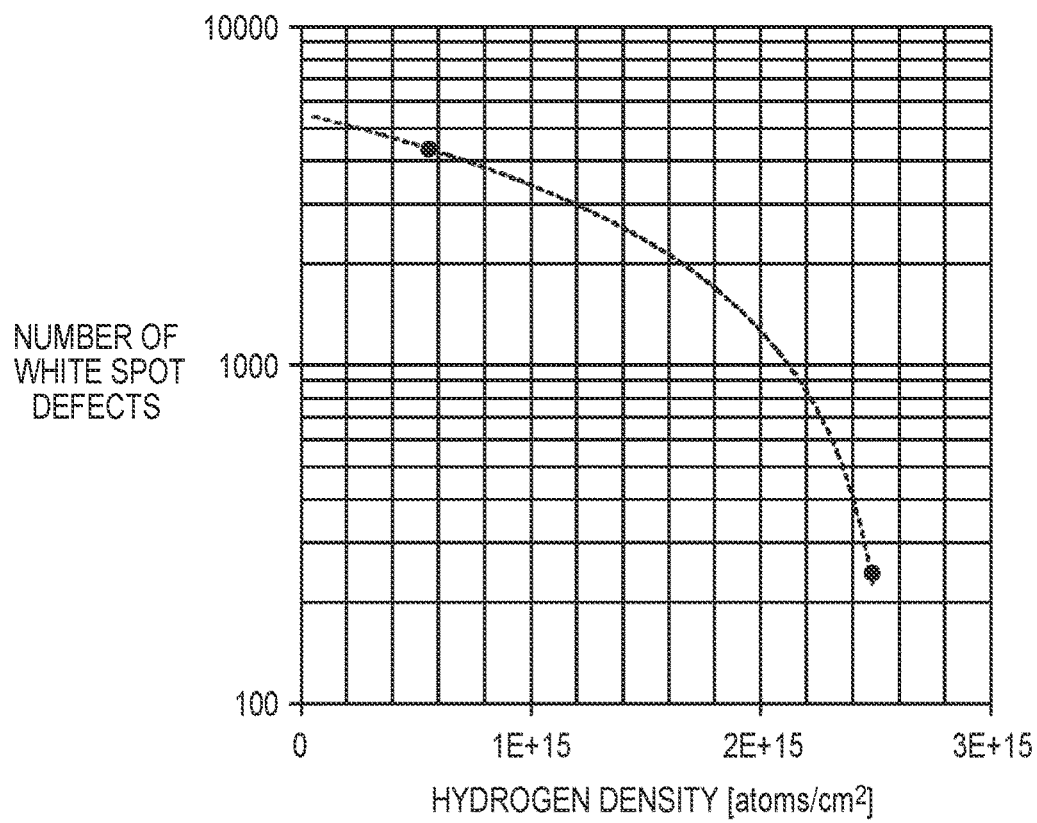
FIG. 17 is a graph for explaining the element isolation part.

FIG. 17 shows the relationship between the number of white spot defects and the hydrogen density.

One of two points shown in the graph of FIG. 17 corresponds to FIG. 16A, and the hydrogen density DA calculated from the distribution of the hydrogen concentration CA is $5.5 \times 10^{14}$ [atoms/cm$^2$]. The other of the two points shown in the graph of FIG. 17 corresponds to FIG. 16B, and the hydrogen density DA calculated from the distribution of the hydrogen concentration CA is $2.5 \times 10^{15}$ [atoms/cm$^2$]. The higher the hydrogen density DA is, the more the white spot defects can be reduced, as can be seen. If the hydrogen density DA is $2 \times 10^{14}$ [atoms/cm$^2$], the number of white spot defects is expected to be about 5,000. To reduce the number of white spot defects by half from the level of 5,000, the hydrogen density DA is set to $1.4 \times 10^{15}$ [atoms/cm$^2$], as can be seen. When the hydrogen density DA is set to $1.4 \times 10^{15}$ [atoms/cm$^2$], the white spot defects can sufficiently be reduced.

The relationship between the element isolation part ISO in the pixel area RA and the element isolation part STI in the peripheral area RB described in the second embodiment will be described next. Let CB [atoms/cm$^3$] be the hydrogen concentration in the insulating member of the element isolation part STI in the peripheral area RB shown in FIGS. 13A to 13E. The hydrogen concentration CB in the insulating member of the element isolation part STI in the peripheral area RB is preferably lower than the hydrogen concentration CA in the insulator INS (insulating member IM) of the element isolation part ISO in the pixel area RA. Various defects occur in the substrate S in the manufacturing process of the imaging apparatus 100. Examples of the defects are a point defect in the semiconductor substrate S and an interface level existing in the interface between the substrate S and the element isolation part ISO. Other examples are an interface level existing in the interface between the substrate S and a gate insulating film and a defect in the gate insulating film. These defects lead to degradation of the performance of a transistor or an increase in noise generated in the pixel circuit area. The noise generated in the pixel area RA directly affects the image quality. Hence, in the pixel area RA, hydrogen termination of defects is preferably prompted by increasing the hydrogen supply amount. On the other hand, in the peripheral area RB, the hydrogen supply amount is preferably limited in a case in which the main purpose is to ensure the reliability of a MIS transistor. The reason is as follows. In the imaging apparatus 100, microfabrication of a MIS transistor that forms the peripheral area RB progresses to meet a requirement of speeding up signal processing or reducing power consumption. Along with the progress of microfabrication, lowering of the reliability of the MIS transistor such as lowering of the hot carrier resistance or NBTI (Negative Bias Temperature Instability) comes to the surface. If hydrogen excessively exists, degradation in the characteristic is prompted. An improvement of the characteristic in the pixel area RA and that in the peripheral area RB can simultaneously be implemented by meeting CB<CA.

The hydrogen concentration difference between the pixel area RA and the peripheral area RB can be implemented by, for example, causing the protective film PDP in the pixel area RA to suppress out diffusion of hydrogen in the insulating member of the element isolation part STI and removing the protective film PDP in the peripheral area RB. This can also be implemented by changing a wiring structure serving as a hydrogen inhibition member between the pixel area RA and the peripheral area RB and thus changing the hydrogen supply amount from a hydrogen supply source such as a passivation film provided above the wiring structure.

As the hydrogen concentration in the insulator INS of the element isolation part ISO, a value calculated by SIMS analysis can be employed. The SIMS analysis of the element isolation part ISO can be done from the surface (back surface) on the opposite side of the surface (front surface) provided with the element isolation part ISO and transistors in the substrate S. The SIMS analysis can also be done from the front surface side of the substrate S in a state in which all layers other than the substrate S and the element isolation part ISO are removed. A method of calculating the hydrogen concentration CA will be described below.

Figure 18:
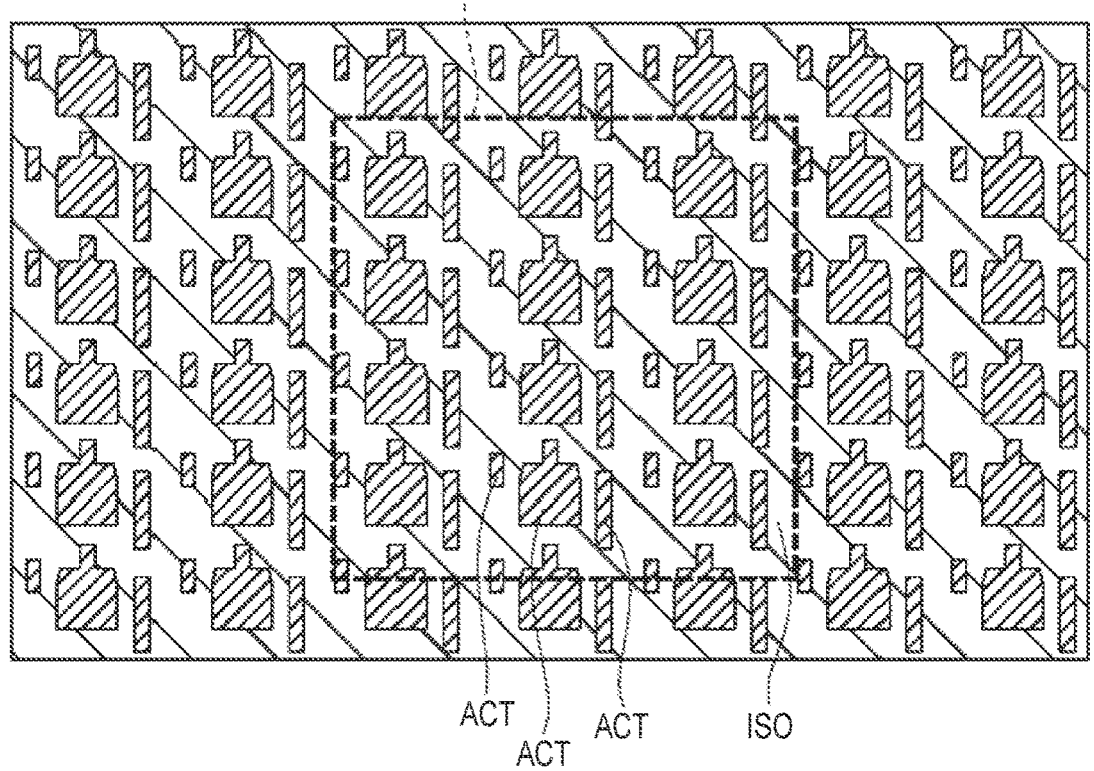
FIG. 18 is a view for explaining the element isolation part.

FIG. 18 shows the outline of the wiring pattern of element parts ACT and the element isolation parts ISO in the pixel area RA and an analysis area AA by SIMS. The analysis area AA is a rectangular area having a side length of several ten μm or a circular area having a diameter of several tens of μm. Let SC (cm$^2$) be the area of the analysis area AA. In the pixel area RA, several μm long pixel circuit patterns are repetitively arrayed. For this reason, the analysis area AA includes several to several tens of pixel circuit patterns. SIMS analysis is executed for the analysis area AA to calculate a hydrogen concentration MA (atoms/cm$^3$) in the analysis area AA. Note that since the pixel area RA includes the repetitive pattern of the pixel circuits, almost the same hydrogen concentration MA is obtained in the analysis area AA irrespective of the area to perform SIMS analysis in the pixel area RA. Note that the element parts ACT are made of silicon having a low hydrogen solubility limit. On the other hand, the element isolation parts ISO are made of an insulator such as silicon oxide having a high hydrogen solubility limit. For this reason, the hydrogen concentration in the element parts ACT is negligibly low as compared to the hydrogen concentration in the element isolation parts ISO. Focusing on the fact that the element parts ACT and the element isolation part ISO are included in the analysis area AA of the hydrogen concentration MA, it may be said that the hydrogen concentration MA obtained by the SIMS analysis is the average hydrogen concentration in the SIMS analysis area including the element parts ACT and the element isolation parts ISO. The hydrogen concentration in the element parts ACT is negligibly low as compared to the hydrogen concentration in the element isolation parts ISO. Hence, the hydrogen concentration MA obtained by the SIMS analysis does not equal the hydrogen concentration CA in the element isolation parts ISO. This is because the element isolation parts ISO do not exist all over the analysis area, and the element parts ACT and the element isolation parts ISO coexist in the analysis area. The hydrogen concentration CA in the actual element isolation parts ISO is calculated in the following way. First, an area occupancy OA of the element isolation parts ISO in the analysis area AA is calculated. The area occupancy can be calculated from CAD data used in the layout design of the element isolation parts ISO. The area occupancy OA of the element isolation parts ISO is a value obtained by dividing a total sum SA (cm$^2$) of the areas of the element isolation parts ISO on the planar view of the analysis area AA by an area SC of the analysis area AA (OA=SA/SC). The hydrogen concentration CA in the insulator of the element isolation parts ISO is a value obtained by dividing the hydrogen concentration MA in the analysis area AA by the area occupancy OA of the element isolation parts ISO (CA=MA/OA). The area occupancy OA is a value larger than 0 and smaller than 1 and is about 0.2 to 0.6. In the imaging apparatus 100, to make the light receiving area of the photoelectric conversion elements PD larger, the element parts ACT in the pixel area RA are set to be larger than the element isolation parts ISO, and the area occupancy OA can be 0.5 or less.

The hydrogen concentration CB in the peripheral area RB can be calculated in the same way. That is, the hydrogen concentration CB in the insulating members IM of the element isolation parts STI in the peripheral area RB is a value obtained by dividing a hydrogen concentration MB in the analysis area of the peripheral area RB by an area occupancy OB of the element isolation parts STI (CB=MB/OB). The area occupancy OB of the element isolation parts STI is a value obtained by dividing a total sum SB (cm$^2$) of the areas of the element isolation parts STI on the planar view of the analysis area of the peripheral area RB by the area SC of the analysis area (OB=SB/SC).

In the imaging apparatus 100, to make the light receiving area of the photoelectric conversion elements PD larger, the element parts in the pixel area RA are set to be larger than the element isolation parts ISO. For this reason, the area occupancy OA of the element isolation parts ISO in the pixel area RA is lower than the area occupancy OB of the element isolation parts STI in the peripheral area RB (OA<OB). On the other hand, the hydrogen amount supplied from the element isolation parts ISO or STI per unit area is preferably larger in the pixel area RA than in the peripheral area RB. A hydrogen amount QA suppliable from the element isolation parts ISO per unit area in the pixel area RA is proportional to a value obtained by multiplying the hydrogen concentration CA by the area occupancy OA (QA∝CA×OA). Similarly, a hydrogen amount QB suppliable from the element isolation parts STI per unit area in the peripheral area RB is proportional to a value obtained by multiplying the hydrogen concentration CB by the area occupancy OB (QB∝CB×OB). Hence, to meet QB<QA means to meet CB×OB<CA×OA. To meet both OA<OB and CB×OB<CA×OA, it is more preferable to meet 10×CB≤CA. Note that since CA×OA=MA, and CB×OB=MB, whether QB<QA is met can be determined by comparing hydrogen amounts detected in the analysis areas of the same shape in the pixel area RA and the peripheral area RB upon SIMS analysis.

Oxygen concentrations in the above-described first to fourth embodiments can also be analyzed by SIMS. In this case, the SIMS analysis area includes not only a semiconductor region but also the element isolation parts ISO. For this reason, the existence of oxygen in silicon oxide that forms the element isolation parts ISO is strongly reflected on the oxygen concentration at a depth (for example, 0.1 to 0.5 μm) at which the element isolation parts ISO exist out of the substrate S in SIMS data. The oxygen derived from the silicon oxide of the element isolation parts ISO should be distinguished from oxygen in the semiconductor region. Realistically, the oxygen concentration at the depth at which the element isolation parts ISO exist in the SIMS analysis data of the substrate S can be excluded from the oxygen concentration distribution in the semiconductor region. Note that the oxygen concentration in the semiconductor region of a portion shallower than the bottom surfaces of the element isolation parts ISO can also be evaluated by performing measurement by SIMS after the element isolation parts ISO are removed from the surface of the substrate S by wet etching or the like.

The first embodiment aims at supplying oxygen from the inner surfaces of the trenches TR to the deep portion of the second semiconductor region 102. Neglecting the oxygen concentration at the depth at which the element isolation parts 110 exist is not inconsistent with the aim of the first embodiment. Hence, it is only necessary to evaluate the range, maximum value, and minimum value of the oxygen concentration in the semiconductor substrate SUB in a portion deeper than the element isolation parts 110. In other words, it is only necessary to the range, maximum value, and minimum value of the oxygen concentration in the semiconductor substrate SUB in a portion deeper than the portions that form the bottom surfaces of the element isolation parts 110 out of the surface of the semiconductor substrate SUB. Note that the graph of FIG. 9 does not illustrate the oxygen concentration at the depth at which the element isolation parts 110 exist.

In the second embodiment, the p-type region R3 is formed such that the net concentration of the p-type impurity in one part becomes higher than the net concentration of the p-type impurity in another part at a position deeper than the one part, thereby preventing the depletion layer from reaching the other part deeper than the one part. The one part can be, for example, the portion P1, and the other part can be, for example, the n-type charge accumulation part or, for example, the portions P2 to P4 deeper than the portion P1. This can decrease the width of the depletion layer between the n-type region R1 and the p-type region R3 and suppress white spot defects in an image. In the second embodiment, the peak position Q_R1 in the n-type region R1 is located deeper than ½ the depth of the element isolation part STI, and may preferably be located deeper than the bottom surface of the element isolation part STI.

The second embodiment is also applicable to a so-called back-illuminated imaging apparatus in which optical elements such as a color filter and a microlens are arranged on a side (back surface side) opposite to the front surface side of the semiconductor substrate provided with transistors and interconnection layers. In this case, the n-type region R2 or n-type region R4 may be absent, and the p-type region R3 may be arranged on the back surface in an exposed state. In the back-illuminated imaging apparatus, a single crystal silicon layer can be formed by epitaxial growth on the n-type region R4 as a silicon wafer. The n-type region R1 or p-type region R3 can be formed by ion implantation into the single crystal silicon layer. After that part (corresponding to the n-type region R2) of the single crystal silicon layer is removed by polishing. However, if oxygen diffuses to the single crystal silicon layer before polishing, and oxygen exists in the p-type region as described above, the influence of an afterimage can similarly be generated. In addition, the problem of an afterimage is readily posed by light such as blue light that can easily be absorbed by silicon. Hence, applying the present invention to the back-illuminated imaging apparatus is advantageous. For example, if at least part of the p-type region R3 located on the back surface side on which light enters has a low oxygen concentration, the influence of an afterimage can be reduced. In addition, if a structure capable of suppressing extension of the depletion layer to the p-type region R3 is employed, the influence of white spot defects in association with polishing of the substrate can be reduced.

The above-described embodiments can appropriately be combined without departing from the spirit of the present invention, and the combination constitutes part of the disclosure. In addition, matters that can obviously be grasped from the drawings, in particular, detailed numerical values and the like in various kinds of graphs constitute part of the present invention even without a clear description in this specification.

According to the present invention, there is provided a technique advantageous in suppressing generation of an afterimage.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of manufacturing an imaging apparatus, comprising:
    preparing a substrate comprising a wafer and a silicon layer arranged on the wafer, the wafer including a first semiconductor region made of single crystal silicon with an oxygen concentration of $2\times10^{16}$ atoms/cm$^3$ to $4\times10^{17}$ atoms/cm$^3$, and the silicon layer including a second semiconductor region made of single crystal silicon with an oxygen concentration lower than the oxygen concentration in the first semiconductor region;
    forming a trench in the silicon layer of the substrate;
    performing a first annealing for the substrate in an atmosphere containing oxygen such that an inner surface of the trench is oxidized and the oxygen concentration in the second semiconductor region is set within a range of $2\times10^{16}$ atoms/cm$^3$ to $4\times10^{17}$ atoms/cm$^3$;
    forming an impurity region of a conductivity type opposite to a conductivity type of the second semiconductor region along the inner surface of the trench;
    performing, after the forming of the impurity region, a second annealing for the substrate in an atmosphere not containing oxygen such that an oxygen concentration of a surface of the substrate is reduced and the oxygen concentration in the second semiconductor region is maintained within the range of $2\times10^{16}$ atoms/cm$^3$ to $4\times10^{17}$ atoms/cm$^3$; and
    forming, after the second annealing, a charge accumulation region of a photoelectric conversion element in the second semiconductor region.

2. The method according to claim 1, wherein the forming of the impurity region is performed after the first annealing and before the second annealing.

3. The method according to claim 1, further comprising filling the trench with an insulator after the first annealing and before the second annealing.

4. The method according to claim 3, wherein the insulator includes a portion in which a hydrogen concentration is not less than $5\times10^{18}$ atoms/cm$^3$.

5. The method according to claim 3, wherein the insulator includes a portion in which a hydrogen concentration is distributed within a range of $2\times10^{19}$ atoms/cm$^3$ to $1\times10^{21}$ atoms/cm$^3$.

6. The method according to claim 1, wherein the first annealing is executed at a temperature of 800° C. to 1,150° C.

7. The method according to claim 1, wherein in the first annealing, the substrate is cooled at a temperature drop rate of not less than 1° C./sec after the substrate is heated.

8. The method according to claim 1, wherein the silicon layer comprises an epitaxial layer having a thickness of 5 μm to 25 μm.

9. The method according to claim 1, further comprising forming a gate electrode on a surface of the substrate,
    wherein C22max/C22min≤10, where C22max is a maximum value of the oxygen concentration in the second semiconductor region after the gate electrode is formed and C22min is a minimum value of the oxygen concentration in the second semiconductor region after the gate electrode is formed.

10. The method according to claim 1, wherein the second semiconductor region has the same conductivity type as the first semiconductor region,
   wherein in the forming of the photoelectric conversion element, a first impurity region of a conductivity type different from the conductivity type of the second semiconductor region is formed between the first semiconductor region and the surface of the substrate, and a second impurity region of the same conductivity type as the conductivity type of the second semiconductor region is formed between the first impurity region and the surface of the substrate.

11. The method according to claim 1, further comprising, after the first annealing and before the second annealing, forming an impurity region of a conductivity type opposite to the conductivity type of the second semiconductor region within the second semiconductor region as a part of the photoelectric conversion element.

* * * * *